United States Patent
Higashi

(10) Patent No.: US 8,085,071 B2
(45) Date of Patent: Dec. 27, 2011

(54) PHASE-LOCKED LOOP CIRCUIT AND DELAY-LOCKED LOOP CIRCUIT

(75) Inventor: Hirohito Higashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/360,552

(22) Filed: Jan. 27, 2009

(65) Prior Publication Data

US 2009/0189655 A1 Jul. 30, 2009

(30) Foreign Application Priority Data

Jan. 29, 2008 (JP) ................................. 2008-018081

(51) Int. Cl.
*H03L 7/06* (2006.01)
(52) U.S. Cl. ........................................ 327/157; 327/148
(58) Field of Classification Search ................. 327/148, 327/157
See application file for complete search history.

(56) References Cited

U.S. PATENT DOCUMENTS

| | | | | |
|---|---|---|---|---|
| 6,597,217 B2* | 7/2003 | Ingino, Jr. | ...................... | 327/157 |
| 6,642,759 B1* | 11/2003 | Hughes | ........................ | 327/157 |
| 6,747,497 B2* | 6/2004 | Ingino, Jr. | ...................... | 327/157 |
| 6,859,108 B2* | 2/2005 | Abbasi et al. | .................... | 331/17 |
| 7,152,009 B2* | 12/2006 | Bokui et al. | .................... | 702/107 |
| 7,180,344 B2* | 2/2007 | Mayer et al. | .................... | 327/156 |
| 7,616,069 B2* | 11/2009 | Li | ..................... | 331/25 |
| 7,616,071 B2* | 11/2009 | Tashiro et al. | .................... | 331/78 |
| 7,653,359 B2* | 1/2010 | Darabi | ............................ | 455/76 |
| 7,692,461 B2* | 4/2010 | Haerle | .......................... | 327/157 |
| 2003/0020526 A1* | 1/2003 | Ingino, Jr. | ...................... | 327/157 |
| 2009/0174446 A1* | 7/2009 | Park | ........................ | 327/157 |
| 2009/0189655 A1* | 7/2009 | Higashi | ......................... | 327/157 |
| 2009/0302908 A1* | 12/2009 | Nakamura | ...................... | 327/157 |
| 2010/0073051 A1* | 3/2010 | Rao et al. | ........................ | 327/157 |
| 2011/0080199 A1* | 4/2011 | Yen et al. | ........................ | 327/157 |
| 2011/0181304 A1* | 7/2011 | Gehrig | ........................... | 324/674 |

FOREIGN PATENT DOCUMENTS

| | | |
|---|---|---|
| JP | 2005-236431 A | 9/2005 |
| JP | 2006-033197 A | 2/2006 |
| JP | 2006-222939 A | 8/2006 |

* cited by examiner

*Primary Examiner* — Lincoln Donovan
*Assistant Examiner* — Adam Houston
(74) *Attorney, Agent, or Firm* — Arent Fox LLP

(57) ABSTRACT

A phase-locked loop circuit includes a phase comparator that compares phases between a reference signal and a feedback signal and outputs a phase difference signal indicating a phase difference therebetween; a charge pump that outputs a charge pump current according to the phase difference signal; a low-pass filter that includes a resistor and a capacitor and that smoothes the charge pump current and converts the smoothed current into a control voltage; a voltage-controlled oscillator that generates an oscillation signal with a frequency according to the control voltage; and a frequency divider that generates a frequency-divided signal by frequency-dividing the oscillation signal and outputs the frequency-divided signal to the phase comparator as the feedback signal, wherein the resistor in the low-pass filter is a variable resistor that is changed according to the control voltage.

9 Claims, 26 Drawing Sheets

PHASE-LOCKED LOOP CIRCUIT AND DELAY-LOCKED LOOP CIRCUIT

CROSS-REFERENCE TO RELATED APPLICATIONS

This application is based upon and claims the benefit of priority from the prior Japanese Patent Application No. 2008-18081 filed on Jan. 29, 2008, the entire contents of which are incorporated herein by reference.

BACKGROUND

1. Field

The present invention relates to a phase-locked loop circuit having a low-pass filter and a delay-locked loop circuit having a low-pass filter.

2. Description of Related Art

FIG. 16 is a block diagram showing an exemplary configuration of a phase-locked loop circuit. The phase-locked loop (hereinafter, referred to as PLL) circuit has a phase comparator (PFD) 101, a charge pump 102, a low-pass filter (LPF) 103, a voltage-controlled oscillator (VCO) 104, and a frequency divider 105.

FIG. 17 is a circuit diagram showing an exemplary configuration of the voltage-controlled oscillator 104 in FIG. 16. The voltage-controlled oscillator 104 is, for example, a ring oscillator in which four VCO units 111 are ring-connected. Each VCO unit 111 has a variable resistor 1701, a differential amplifier 1702, and a current source 1703. The variable resistor 1701 is connected between a power supply voltage node and a power supply terminal of the differential amplifier 1702. The resistance value of the variable resistor 1701 changes according to a control voltage Vcntl.

FIG. 18 is a circuit diagram showing exemplary configurations of the low-pass filter 103 and the voltage-controlled oscillator 104 in FIG. 16. First, the configuration of the low-pass filter 103 will be described. The low-pass filter 103 is a passive low-pass filter having capacitors C1 and C2 and a resistor R1. A series-connected circuit including the capacitor C1 and the resistor R1 is connected between a power supply voltage node and a node of a control voltage Vcntl. The capacitor C2 is connected between a power supply voltage node and a node of the control voltage Vcntl.

FIG. 19 is a block diagram showing an exemplary configuration of a delay-locked loop circuit. The delay-locked loop (hereinafter, referred to as DLL) circuit has a phase comparator (PFD) 101, a charge pump 102, a low-pass filer (LPF) 103, and a voltage-controlled delay device (VCDL) 121.

FIG. 20 is a circuit diagram showing an exemplary configuration of the voltage-controlled delay device 121 in FIG. 19. The voltage-controlled delay device 121 is, for example, a delay line having four VCDL units 122. Each VCDL unit 122 has a variable resistor 2001, a differential amplifier 2002, and a current source 2003. The VCDL units 122 have the same configuration as the VCO units 111 in FIG. 17. Reference clock differential signals RCK1 and RCK2 are differential signals of a reference clock signal RCK in FIG. 19. Output clock differential signals TCK1 and TCK2 are differential signals of an output clock signal TCK in FIG. 19.

FIG. 21 is a circuit diagram showing exemplary configurations of the low-pass filter 103 and the voltage-controlled delay device 121 in FIG. 19. The low-pass filter 103 has the same configuration as the low-pass filter 103 in FIG. 18. The voltage-controlled delay device 121 has transistors M11 and M12 and four VCDL units 122. The transistors M11 and M12 have the same configuration as transistors M11 and M12 in FIG. 18. The VCDL unit 122 has the same configuration as a VCO unit 111 in FIG. 18. The four VCDL units 122 are connected in series as shown in FIG. 20.

In recent years, such a PLL circuit and a DLL circuit having high universality have been required. Hence, the voltage-controlled oscillator 104 oscillating over a broad band and the voltage-controlled delay device 121 requiring a wide-range delay have been developed.

As shown in FIGS. 17 and 18, the voltage-controlled oscillator 104 includes VCO units 111 in which a plurality of stages of CML ring elements are arranged and which apply positive feedback; and bias circuits M11 and M12 that supply a bias voltage to the ring elements. As shown in FIGS. 20 and 21, the voltage-controlled delay device 121 includes VCDL units 122 in which a plurality of stages of CR delay elements are arranged and which apply positive feedback; and bias circuits M11 and M12 that supply a bias voltage to the VCDL units 122. A control voltage Vcntl from the low-pass filter 103 is input to the bias circuits M11 and M12. The bias circuits M11 and M12 each output a bias voltage proportional to the control voltage Vcntl. The bias voltages control a tail current source transistor M27 and load transistors M22 and M23 of a CML. Though there is a scheme to control only load transistors or only a tail current source transistor, it is common practice to use a scheme to simultaneously control both, when a constant amplitude needs to be maintained regardless of the oscillation frequency. For the low-pass filter 103, in the case of charge pump PLL and DLL circuits, it is common practice for the low-pass filter 103 to include only passive elements. Depending on the application, the low-pass filter 103 may be an active filter.

However, in the case of the PLL circuit in FIGS. 17 and 18 and the DLL circuit in FIGS. 20 and 21, as a result of implementing a broad band or a wide-range delay, the PLL circuit and the DLL circuit have closed-loop function characteristics, such as those shown in FIG. 22.

FIG. 22 is a diagram showing closed-loop functions of the PLL circuit and the DLL circuit. A horizontal axis represents frequency and a vertical axis represents jitter gain. A function 2201 is a function with a lock frequency being 100 MHz. A function 2202 is a function with a lock frequency being 1 GHz. In the case of the PLL circuit, although the cutoff frequency is high at high frequencies, the cutoff frequency is low at low frequencies. A transition of the cutoff frequency indicated by an arrow 2203 affects jitter characteristics in FIG. 23.

FIG. 23 is a diagram showing jitter characteristics relative to frequency. For example, a PLL circuit that can lock in a range from 100 MHz to 1 GHz will be considered. The jitter characteristics as used herein indicate jitter that occurs due to device noise in the voltage-controlled oscillator 104. In a normal PLL circuit, the device noise in the voltage-controlled oscillator 104 is the main cause of jitter. In an ideal jitter characteristic 2301, the VCO gain is constant regardless of the frequency and thus jitter has a constant value. However, in an actual jitter characteristic 2302, the VCO gain decreases with low frequencies and thus jitter increases. The reason why such a problem occurs is that parameters called VCO gain and VCDL gain of the voltage-controlled oscillator 104 and the voltage-controlled delay device 121 fluctuate in the manner shown in FIGS. 24 and 25.

FIG. 24 is a diagram showing a control voltage Vcntl-oscillation frequency fosc characteristic 2400 of the voltage-controlled oscillator 104. The PLL circuit can lock in a frequency range TF in a tuning range RN. Vdd represents the power supply voltage and Vth represents the threshold voltage of transistors. When the control voltage Vcntl is V1, the oscillation frequency fosc is f1 and a VCO gain 2401 is represented by a slope of the characteristic 2400 obtained at that time. When the control voltage Vcntl is V2, the oscillation frequency fosc is f2 and a VCO gain 2402 is represented by a slope of the characteristic 2400 obtained at that time. The VCO gains 2401 and 2402 each are represented by the amount of fluctuation in oscillation frequency fosc relative to the control voltage Vcntl. The frequency f2 is lower than the frequency f1. The VCO gain 2402 at the low frequency f2 is lower than the VCO gain 2401 at the high frequency f1. As a result, as shown in FIG. 23, when the cutoff frequency is made constant in the high-band PLL circuit, jitter increases at low frequencies.

FIG. 25 is a diagram showing a control voltage Vcntl-amount of delay characteristic 2500 of the voltage-controlled delay device 121. The DLL circuit can lock in an amount-of-delay range TD in a tuning range RN. Vdd represents the power supply voltage and Vth represents the threshold voltage of transistors. When the control voltage Vcntl is V1, the amount of delay is T1 and a VCDL gain 2501 is represented by a slope of the characteristic 2500 obtained at that time. When the control voltage Vcntl is V2, the amount of delay is T2 and a VCDL gain 2502 is represented by a slope of the characteristic 2500 obtained at that time. The VCDL gains 2501 and 2502 each are represented by the amount of fluctuation in the amount of delay relative to the control voltage Vcntl. As such, when the cutoff frequency is made constant in the high-band DLL circuit, since the VCDL gain fluctuates according to the amount of delay, jitter increases with the amount of delay.

As shown in the following equation, parameters that determine a cutoff frequency BW are a charge pump current Icp, a resistance R of the low-pass filter 103, a VCO gain (or VCDL gain) K, and a frequency division number N (the case of the PLL circuit). Of them, since only the VCO gain (or VCDL gain) K does not have a fixed value, the cutoff frequency BW fluctuates.

$$BW = Icp \times R \times K / (2 \times \pi \times N)$$

Japanese Laid-Open Patent Publication No. 2005-236431 describes a frequency synthesizer in which a PLL loop includes an oscillator that generates a reference signal; a frequency/phase comparator that compares phases between the reference signal and a signal obtained by frequency-dividing an output signal and outputs a phase difference signal; a charge pump that generates a charge pump current according to the phase difference signal; a low-pass filter that includes a fixed resistor and a fixed capacitor and that performs smoothing and voltage conversion on the charge pump current and outputs a control voltage signal; a voltage-controlled oscillator that generates the output signal having a frequency according to the control voltage signal; and a variable frequency divider that frequency-divides the output signal. The frequency synthesizer includes a variable resistor that is provided between an output terminal of the charge pump and one terminal of the fixed capacitor composing the low-pass filter and that variably sets a plurality of values according to a resistor control signal; and a variable resistor switching time control circuit that outputs the resistor control signal that controls the switching width and switching time of the variable resistor such that the loop gain increases when the frequency of the frequency synthesizer is switched and thereafter gradually decreases.

Japanese Laid-Open Patent Publication No. 2006-33197 discloses a PLL circuit including a phase comparator; a loop filter; a voltage-current conversion circuit that converts a control voltage output from the loop filter into a current; and a voltage-controlled oscillator having a current source appropriate for the output current output from the voltage-current conversion circuit, and having one or more ring-connected differential inverter circuits. The voltage-current conversion circuit has a variable resistor circuit that determines the output current, and reduces process variations.

Japanese Laid-Open Patent Publication No. 2006-222939 discloses a PLL circuit including a phase comparator that compares phase differences between an input signal and a frequency-divided signal and outputs a phase-advanced signal or a phase-delayed signal; a charge pump circuit that outputs a current signal according to the phase-advanced signal or phase-delayed signal output from the phase comparator; a low-pass filter that has a resistor and a capacitor and that smoothes the current signal output from the charge pump circuit and converts the smoothed current signal into a voltage signal; a voltage-controlled oscillation circuit that generates an oscillation signal with a frequency according to the voltage signal output from the low-pass filter; a frequency divider that frequency-divides, by a predetermined frequency division ratio, the oscillation signal output from the voltage-controlled oscillation circuit, to generate the frequency-divided signal; a frequency determination means of determining a change in the frequency of the input signal; and a switching means of switching, according to the determination made by the frequency determination means, at least two circuit constants among a current value of the current signal output from the charge pump circuit, a resistance value of the resistor, a capacitance value of the capacitor, and a frequency division ratio of the frequency divider. When the circuit constants are switched, the switching means simultaneously switches the circuit constants so as to change the band frequency of a PLL loop with the damping factor of the PLL loop being constant.

SUMMARY

According to aspects of an embodiment, a phase-locked loop circuit includes: a phase comparator that compares phases between a reference signal and a feedback signal and outputs a phase difference signal indicating a phase difference therebetween; a charge pump that outputs a charge pump current according to the phase difference signal; a low-pass filter that includes a resistor and a capacitor and that smoothes the charge pump current and converts the smoothed current into a control voltage; a voltage-controlled oscillator that generates an oscillation signal with a frequency according to the control voltage; and a frequency divider that generates a frequency-divided signal by frequency-dividing the oscillation signal and outputs the frequency-divided signal to the phase comparator as the feedback signal, wherein the resistor in the low-pass filter is a variable resistor that is changed according to the control voltage.

According to other aspects of an embodiment, a delay-locked loop circuit includes: a phase comparator that compares phases between a reference signal and a feedback signal and outputs a phase difference signal indicating a phase difference therebetween; a charge pump that outputs a charge pump current according to the phase difference signal; a low-pass filter that includes a resistor and a capacitor and that smoothes the charge pump current and converts the smoothed current into a control voltage; and a voltage-controlled delay device that generates a delay signal by providing an amount of delay according to the control voltage to the reference signal, and outputs the delay signal to the phase comparator as the feedback signal, wherein the resistor in the low-pass filter is a variable resistor that is changed according to the control voltage.

Additional advantages and novel features of aspects of the present invention will be set forth in part in the description that follows, and in part will become more apparent to those skilled in the art upon examination of the following or upon learning by practice thereof.

DESCRIPTION OF THE PREFERRED EMBODIMENTS

First Embodiment

Figure 15:
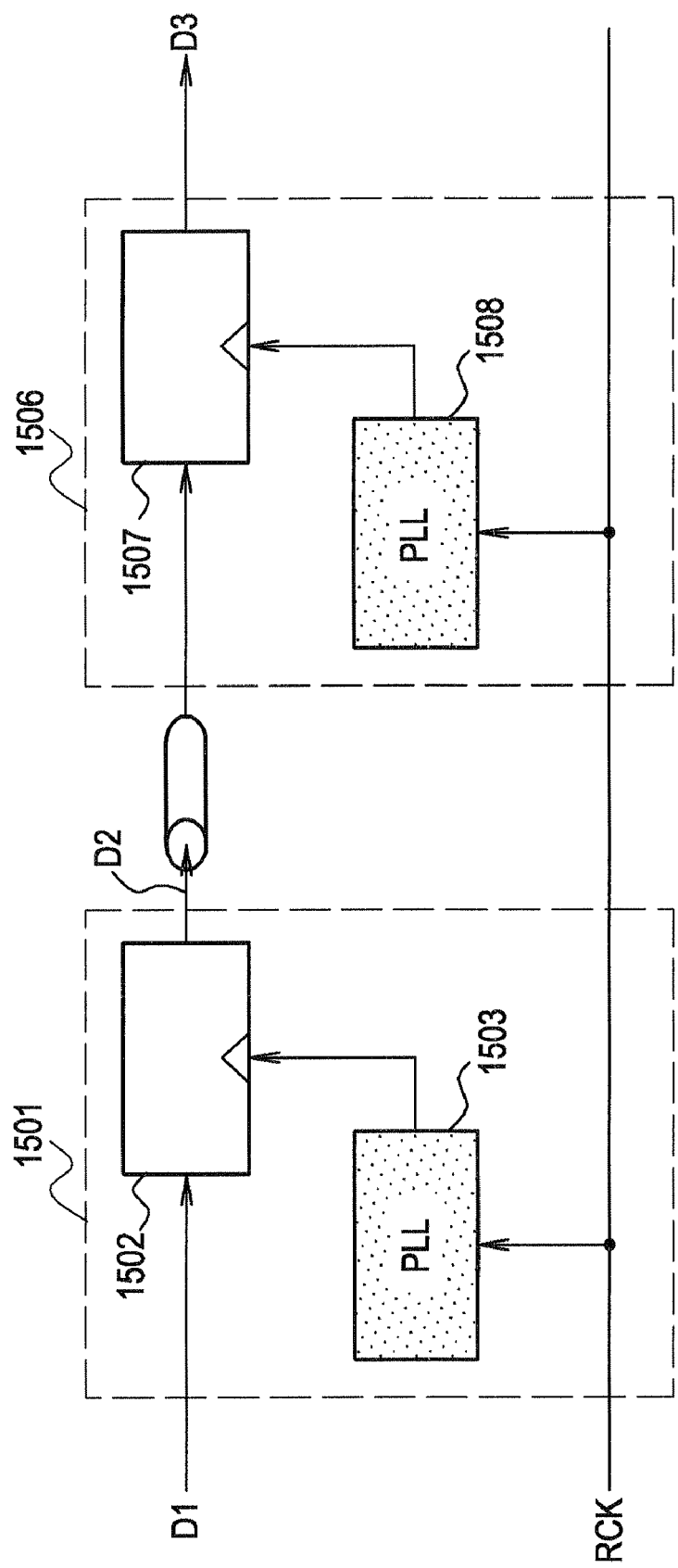
FIG. 15 is a diagram showing an exemplary configuration of a high-speed input/output (I/O) circuit according to the first embodiment in accordance with aspects of the present invention.
Figure 16:
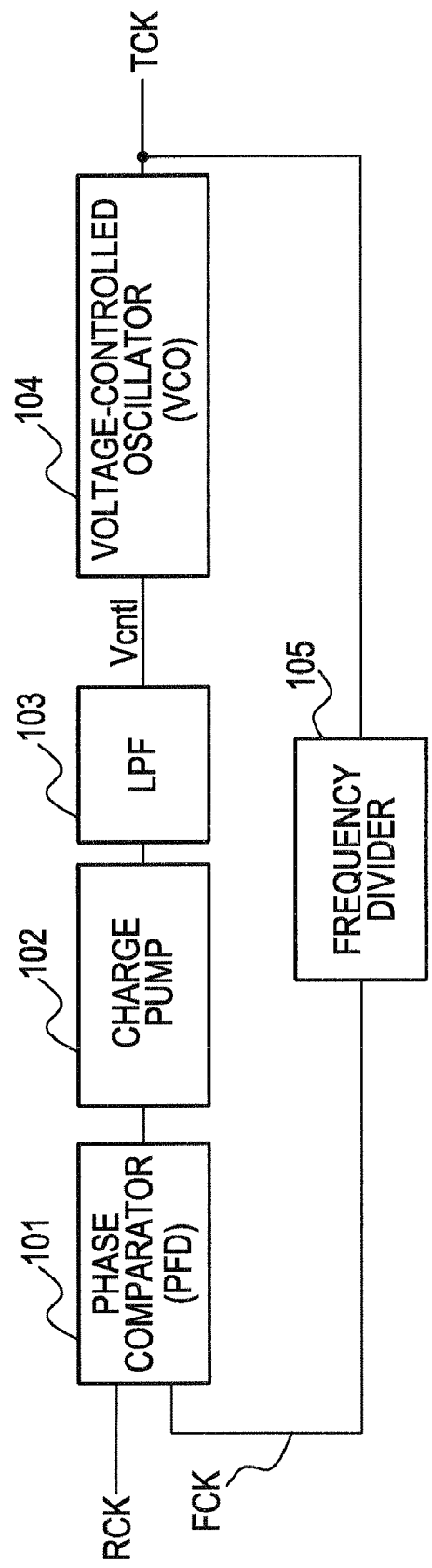
FIG. 16 is a block diagram showing an exemplary configuration of a phase-locked loop circuit.

FIG. 15 is a diagram showing an exemplary configuration of a high-speed input/output (I/O) circuit according to a first embodiment in accordance with aspects of the present invention. A driver 1501 has a parallel/serial converter 1502 and a phase-locked loop (hereinafter, referred to as PLL) circuit 1503. A receiver 1506 has a serial/parallel converter 1507 and a PLL circuit 1508. The PLL circuits 1503 and 1508 each generate a clock signal that synchronizes to a reference clock signal RCK and has a frequency that is an integral multiple of the reference clock signal RCK. The parallel/serial converter 1502 converts parallel data D1 into serial data D2 in synchronization with the clock signal generated by the PLL circuit 1503. The serial/parallel converter 1507 converts the serial data D2 into parallel data D3 in synchronization with the clock signal generated by the PLL circuit 1508. The converters 1502 and 1507 each require a clock signal with a frequency that is half the data rate and the clock signals are generated by the PLL circuits 1503 and 1508. PLL circuits are used in a high-speed I/O circuit, an RF circuit, etc. Delay-locked loop (hereinafter, referred to as DLL) circuits are used in applications similar to those of PLL circuits.

Figure 1:
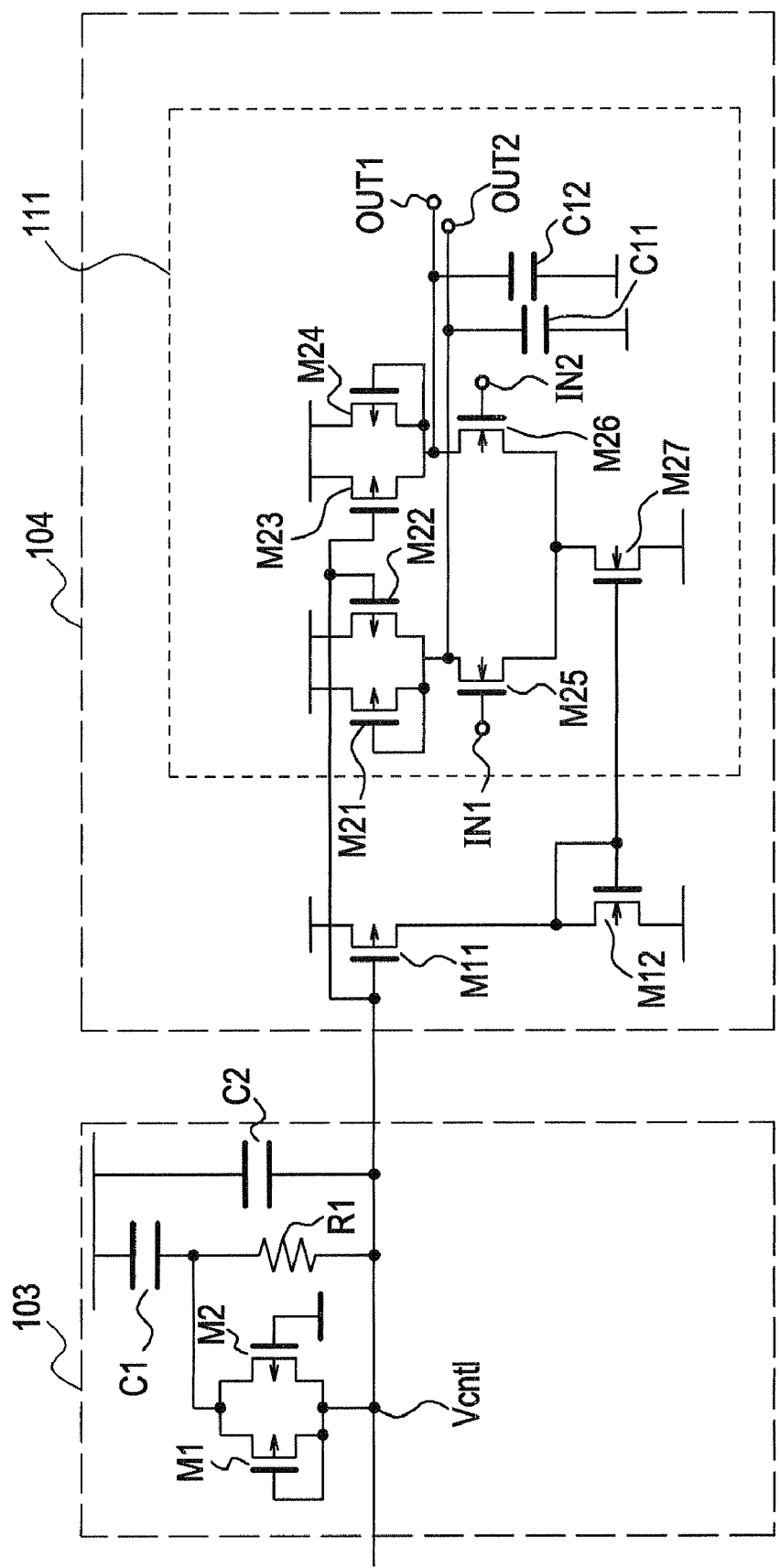
FIG. 1 is a circuit diagram showing exemplary configurations of a low-pass filter and a voltage-controlled oscillator in a PLL circuit according to a first embodiment in accordance with aspects of the present invention.

FIG. 1 is a circuit diagram showing exemplary configurations of a low-pass filter 103 and a voltage-controlled oscillator 104 in a PLL circuit according to the present embodiment. First, the configuration of the low-pass filter 103 will be described. Hereinafter, a MOS field-effect transistor is simply referred to as a transistor. The low-pass filter 103 has capacitors C1 and C2, a resistor R1, and transistors M1 and M2. A series-connected circuit including the capacitor C1 and the fixed resistor R1 is connected between a power supply voltage node and a node of a control voltage Vcntl. The capacitor C2 is connected between a power supply voltage node and a node of the control voltage Vcntl. The p-channel transistor M1 is connected, at its source, to a point of interface between the capacitor C1 and the fixed resistor R1 and connected, at its gate and drain, to a node of the control voltage Vcntl. To a gate of the p-channel transistor M2 is applied a bias voltage (e.g., a reference potential). The p-channel transistor M2 is connected, at its source, to the point of interface between the capacitor C1 and the fixed resistor R1 and connected, at its drain, to the node of the control voltage Vcntl. The transistor M1 is connected in parallel with the transistor M2 and is diode-connected. The fixed resistor R1 is connected between the sources and drains of the transistors M1 and M2.

Figure 17:
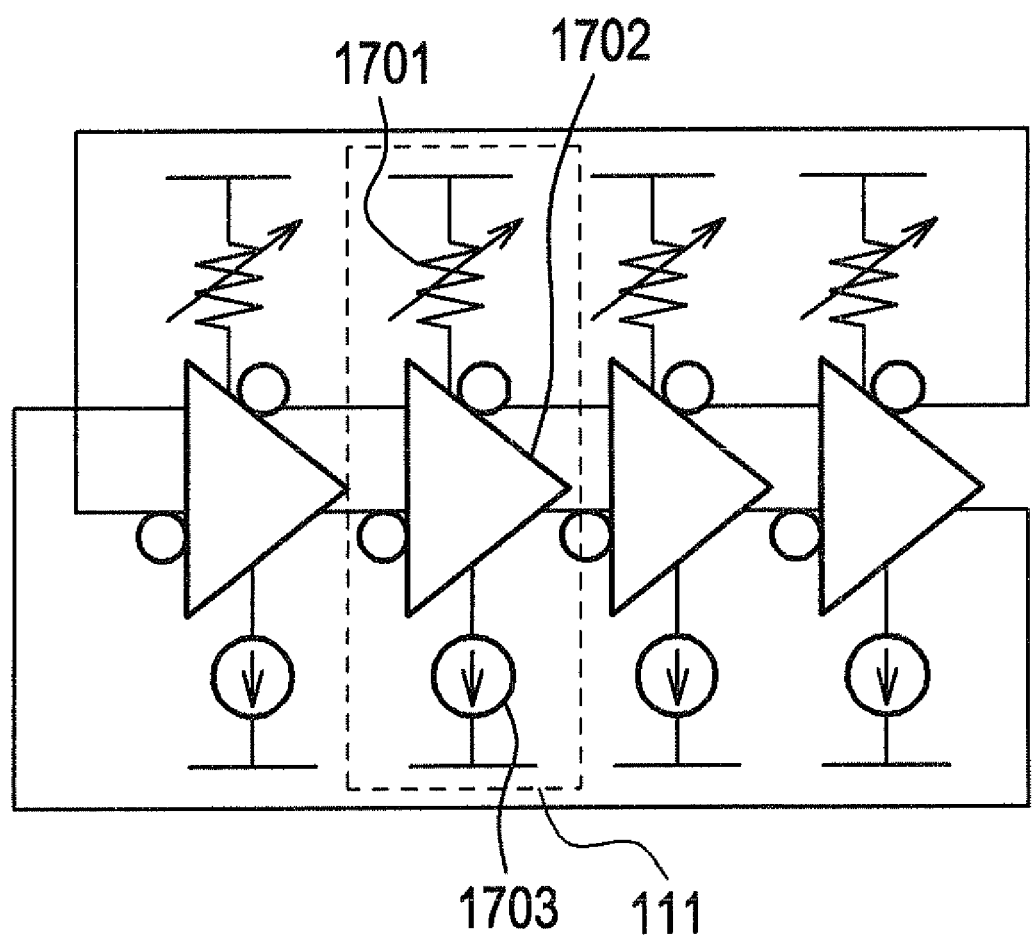
FIG. 17 is a circuit diagram showing an exemplary configuration of a voltage-controlled oscillator in FIG. 16.
Figure 18:
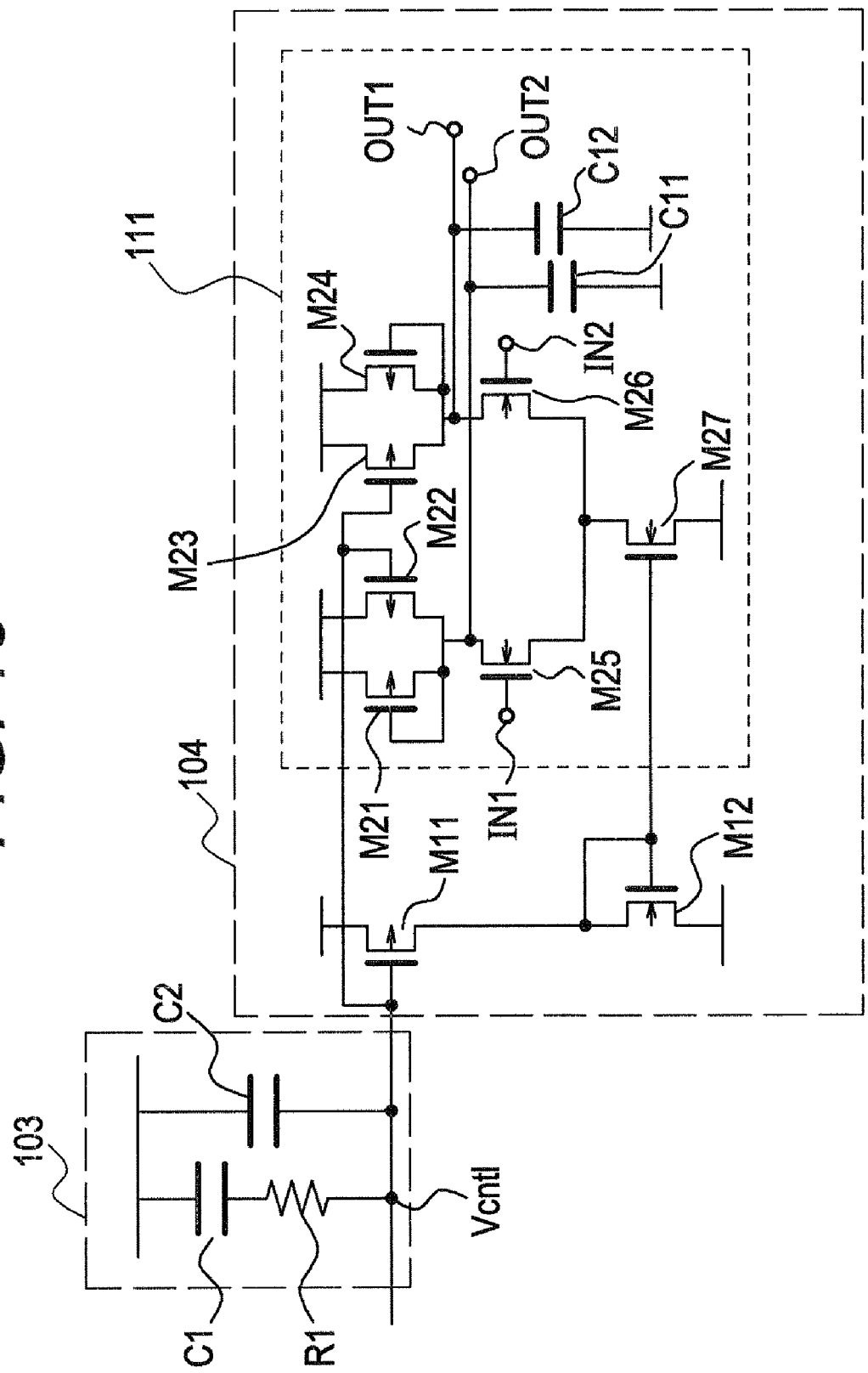
FIG. 18 is a circuit diagram showing exemplary configurations of a low-pass filter and the voltage-controlled oscillator in FIG. 16.

Next, the configuration of the voltage-controlled oscillator 104 will be described. The voltage-controlled oscillator 104 has transistors M11 and M12 and four VCO units 111. The four VCO units 111 are ring-connected, as shown in FIG. 17. The transistors M11 and M12 compose a bias circuit. The p-channel transistor M11 is connected, at its gate, to a node of the control voltage Vcntl and connected, at its source, to a power supply voltage node. The n-channel transistor M12 is connected, at its gate and drain, to a drain of the transistor M11 and connected, at its source, to a reference potential node.

The VCO units 111 each have transistors M21 to M27 and capacitors C11 and C12. The transistors M21 to M24 correspond to a variable resistor 1701 and are load transistors composing a load. The transistor M27 corresponds to a current source 1703. The transistors M25 and M26 correspond to a differential amplifier 1702. Input terminals IN1 and IN2 are differential signal input terminals of the differential amplifier 1702. Output terminals OUT1 and OUT2 are differential signal output terminals of the differential amplifier 1702.

The p-channel transistor M21 is connected, at its source, to a power supply voltage node and connected, at its gate and drain, to the output terminal OUT2. The p-channel transistor M22 is connected, at its gate, to a node of the control voltage Vcntl and connected, at its source, to a power supply voltage node and connected, at its drain, to the output terminal OUT2. The p-channel transistor M23 is connected, at its gate, to the node of the control voltage Vcntl and connected, at its source, to a power supply voltage node and connected, at its drain, to the output terminal OUT1. The p-channel transistor M24 is connected, at its source, to a power supply voltage node and connected, at its gate and drain, to the output terminal OUT1.

The n-channel transistor M25 is connected, at its gate, to the input terminal IN1 and connected, at its drain, to the output terminal OUT2 and connected, at its source, to a drain of the n-channel transistor M27. The n-channel transistor M26 is connected, at its gate, to the input terminal IN2 and connected, at its drain, to the output terminal OUT1 and connected, at its source, to the drain of the n-channel transistor M27. The n-channel transistor M27 is connected, at its gate, to the gate of the transistor M12 and connected, at its source, to a reference potential node. The capacitor C11 is connected between the output terminal OUT2 and a reference potential node. The capacitor C12 is connected between the output terminal OUT1 and a reference potential node.

The voltage-controlled oscillator 104 has the load transistors M21 to M24 composing a load. The transistors M1 and M2 have the same channel length and the same channel width as the load transistors M21 to M24 and have a different number of parallel transistors than the load transistors M21 to M24.

Figure 2:
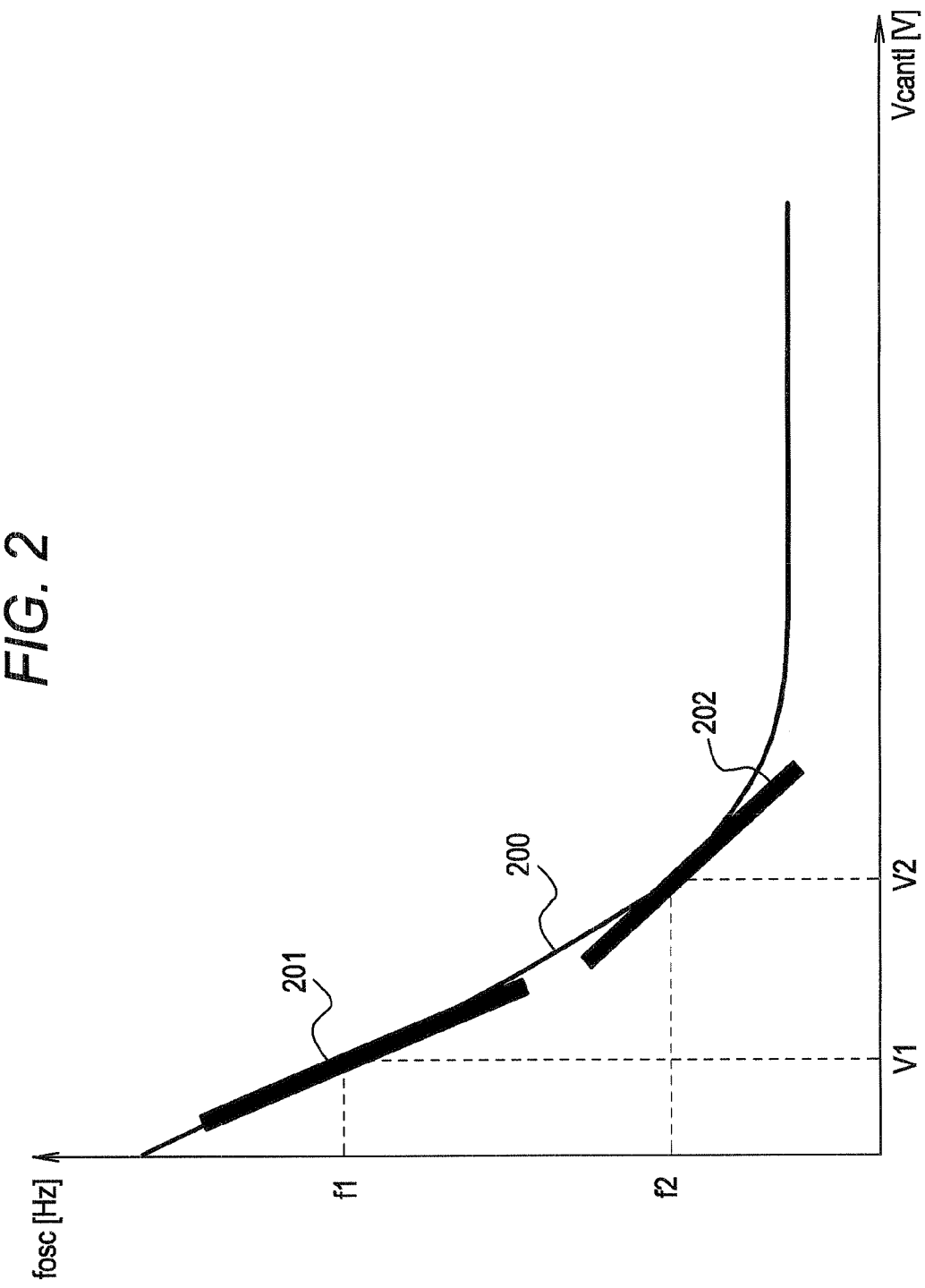
FIG. 2 is a diagram showing a control voltage-oscillation frequency characteristic of the voltage-controlled oscillator.

FIG. 2 is a diagram showing a control voltage Vcntl-oscillation frequency fosc characteristic 200 of the voltage-controlled oscillator 104. When the control voltage Vcntl is V1, the oscillation frequency fosc is f1 and a VCO gain 201 is represented by a slope of the characteristic 200 obtained at that time. When the control voltage Vcntl is V2, the oscillation frequency fosc is f2 and a VCO gain 202 is represented by a slope of the characteristic 200 obtained at that time. The VCO gains 201 and 202 each are represented by the amount of fluctuation in oscillation frequency fosc relative to the control voltage Vcntl. The frequency f2 is lower than the frequency f1. The VCO gain 202 at the low frequency f2 is lower than the VCO gain 201 at the high frequency f1.

For example, it is assumed that the VCO gain 202 is $\alpha$ and the VCO gain 201 is $4 \times \alpha$. A method of making the cutoff frequency constant in the voltage-controlled oscillator 104 in which the VCO gain fluctuates by a factor of 4 will be described below as an example. When correcting the VCO gain, a combined resistor RL in the low-pass filter 103 is made four-times variable to cancel out fluctuations in VCO gain. When the VCO gain 201 is $4 \times \alpha$ the combined resistor RL is made to be R, and when the VCO gain 202 is $\alpha$ the combined resistor RL is made to be $4 \times R$.

Figure 3:
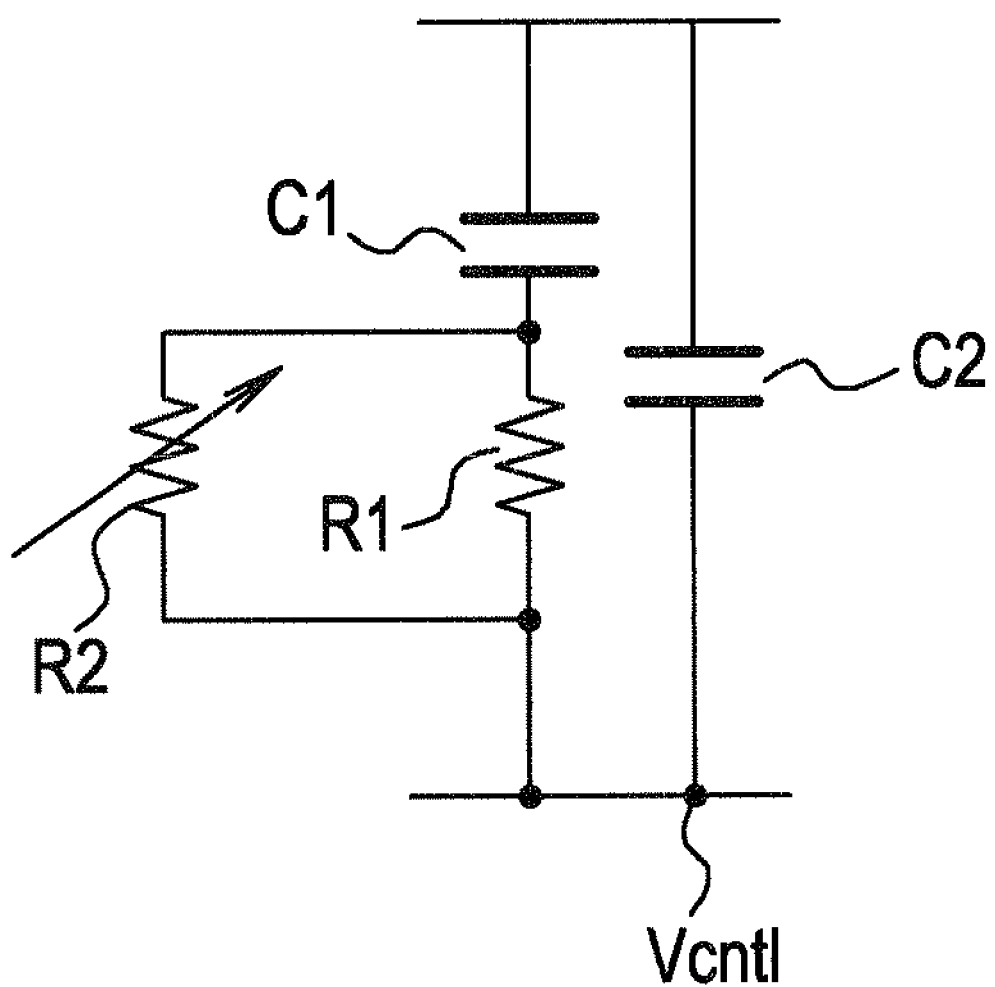
FIG. 3 is an equivalent circuit diagram of the low-pass filter in FIG. 1.

FIG. 3 is an equivalent circuit diagram of the low-pass filter 103 in FIG. 1. A variable resistor R2 corresponds to the transistors M1 and M2 in FIG. 2 and is connected in parallel with the fixed resistor R1. A combined resistor including the transistors M1 and M2 is represented by R2. A combined resistor including the fixed resistor R1 and the variable resistor R2 is represented by RL. When the control voltage Vcntl is V1, the combined resistor RL is made to be a low resistor R. When the control voltage Vcntl is V2, the combined resistor RL is made to be a high resistor $4 \times R$. When the control voltage Vcntl has a range of V1 to V2, the combined resistor RL needs to fluctuate by a factor of 4.

That is, in the voltage-controlled oscillator 104 in which the VCO gain fluctuates by a factor of n, the combined resistor RL needs to fluctuate by a factor of n. Here, when the fixed resistor R1 is set to $n \times R$, the combined resistor RL is represented by the following equation:

$$RL = R1 \times R2 / (R1 + R2)$$
$$= n \times R \times R2 / (n \times R + R2)$$

To make the combined resistor RL to be R when the control voltage Vcntl is V1, the variable resistor R2 should be set as follows:

$$RL = n \times R \times R2/(n \times R + R2) = R$$

$$R2 = n \times R/(n-1)$$

For example, the case of n=4 is considered. When the control voltage Vcntl is V1, the variable resistor R2 should be set to $4 \times R/3$. Specifically, the sizes of the transistors M1 and M2 composing such a variable resistor R2 are estimated from the load transistors M21 to M24 of the voltage-controlled oscillator 104. The fixed resistor R1 is set to $4 \times R$. When the variable resistor R2 approaches infinity when the control voltage Vcntl is V2, the combined resistor RL approaches $R1 = 4 \times R$. By this, when the control voltage Vcntl is V1 the combined resistor RL can be made to be R, and when the control voltage Vcntl is V2 the combined resistor RL can be made to be $4 \times R$.

The low-pass filter 103 has the variable resistor R2 that is changed according to the control voltage Vcntl. The variable resistor R2 has the transistors M1 and M2 each having a drain to which the control voltage Vcntl is applied.

As described above, the transistors M1 and M2 are configured to have the same channel width (gate width) and the same channel length (gate length) as the load transistors M21 to M24 of the voltage-controlled oscillator 104 to adjust the number of parallel transistors, and thereby set a resistance value. Since the amount of fluctuation in VCO gain is determined by the band to be used, the amount of fluctuation can be expressed as n. The characteristic of this structure is that the VCO gain is cancelled by the resistance value of the low-pass filter 103. As shown in the following equation, a VCO gain Kv is proportional to the control voltage Vcntl. Here, Cr is the total capacitance of the ring oscillator in the voltage-controlled oscillator 104.

$$Kv = 2 \times \beta \times \lambda \times (Vcntl - Vth) \times (1 + \lambda \times Vds) \times 1/Cr$$

Hence, by inserting a transistor resistor having a linear characteristic with respect to the control voltage Vcntl, variations in VCO gain are cancelled. Since the gate voltage of the transistor M2 added to the low-pass filter 103 is fixed to the reference potential, the control voltage Vcntl dependence cannot be completely reflected. However, since the gate voltage is sufficiently applied, the transistor M2 can determine a current-voltage (I-V) characteristic by drain voltage dependence. By using this characteristic, the transistor M2 is used as a resistor.

By determining the combined resistor RL of the low-pass filter 103 in the above-described manner, the number of parallel transistors M1 and M2 of the low-pass filter 103 should be finally determined. Even when the transistors M1 and M2 do not have the same channel width and the same channel length as the load transistors M21 to M24 of the voltage-controlled oscillator 104, by adjusting to have the same resistance value, variations in VCO gain can, of course, be cancelled. The point is strictly to cancel variations in VCO gain by a primary or secondary resistor and thus as long as a desired slope of the variable resistor R2 is obtained, the desired effect can be obtained.

Figure 4:
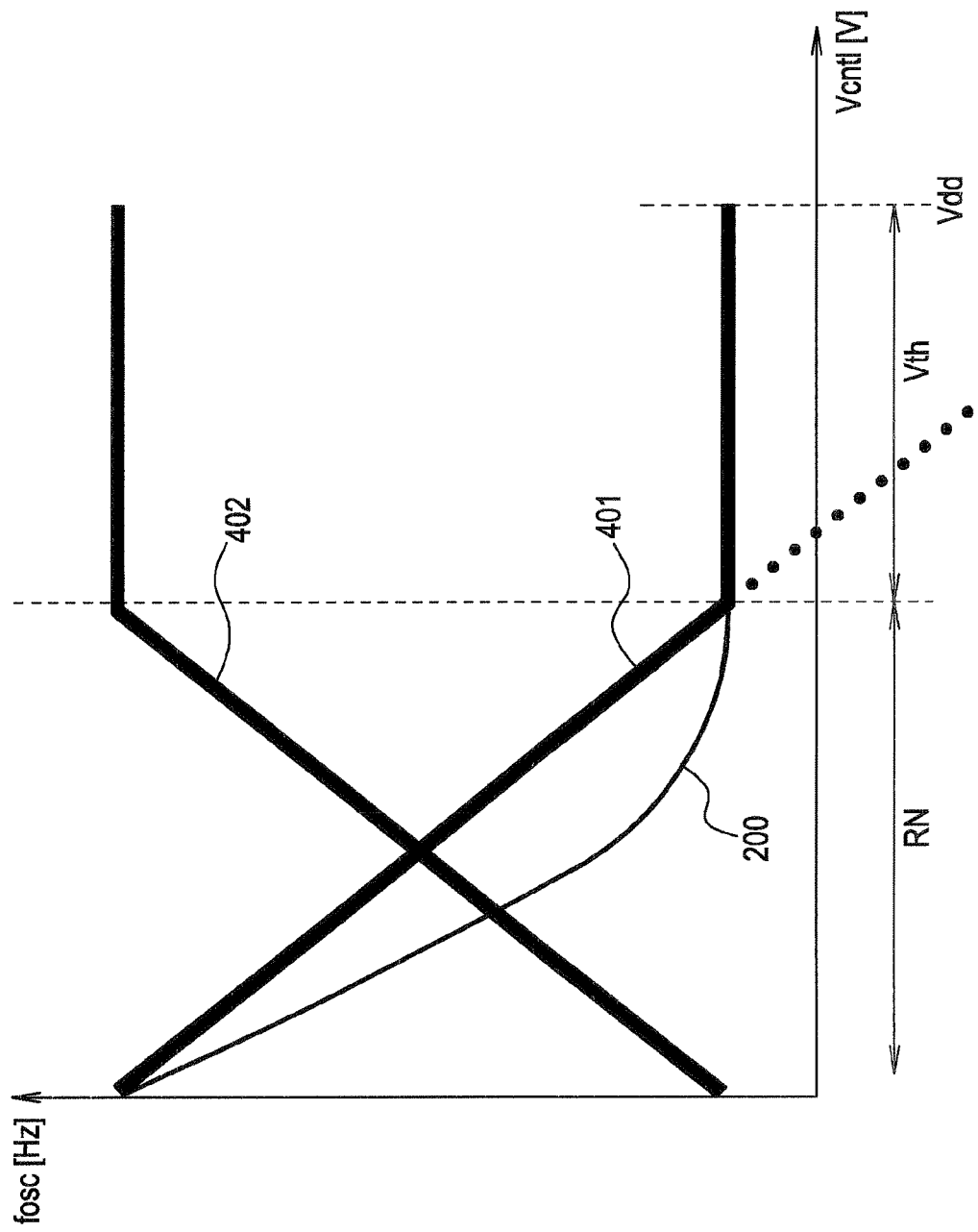
FIG. 4 is a diagram showing a control voltage-oscillation frequency characteristic of the voltage-controlled oscillator.

FIG. 4 is a diagram showing a control voltage Vcntl-oscillation frequency fosc characteristic 200 of the voltage-controlled oscillator 104. The PLL circuit can lock in a tuning range RN. Vdd represents the power supply voltage and Vth represents the threshold voltage of transistors. A characteristic 401 represents an I-V characteristic required for the transistors M1 and M2 in the low-pass filter 103. The I-V characteristic 401 preferably has a primary slope proportional to the control voltage Vcntl and ideally matches the frequency characteristic 200. To implement the I-V characteristic 401, a combined-resistor characteristic 402 is required. The combined-resistor characteristic 402 is a characteristic of the combined resistor RL relative to the control voltage Vcntl. In the case of the PLL circuit, performing a correction by a primary linear curve increases cancellation accuracy. Even when cancellation is performed through a secondary characteristic in the PLL circuit, though cancellation error occurs, there is, of course, an overall effect similar to the case of not performing a correction.

On the low frequency side, the VCO gain is low, the control voltage Vcntl is high, the variable resistor R2 is high, the combined resistor RL is high, and thus fluctuations in cutoff frequency BW can be prevented. On the other hand, on the high frequency side, the VCO gain is high, the control voltage Vcntl is low, the variable resistor R2 is low, the combined resistor RL is low, and thus fluctuations in cutoff frequency BW can be prevented.

Figure 5:
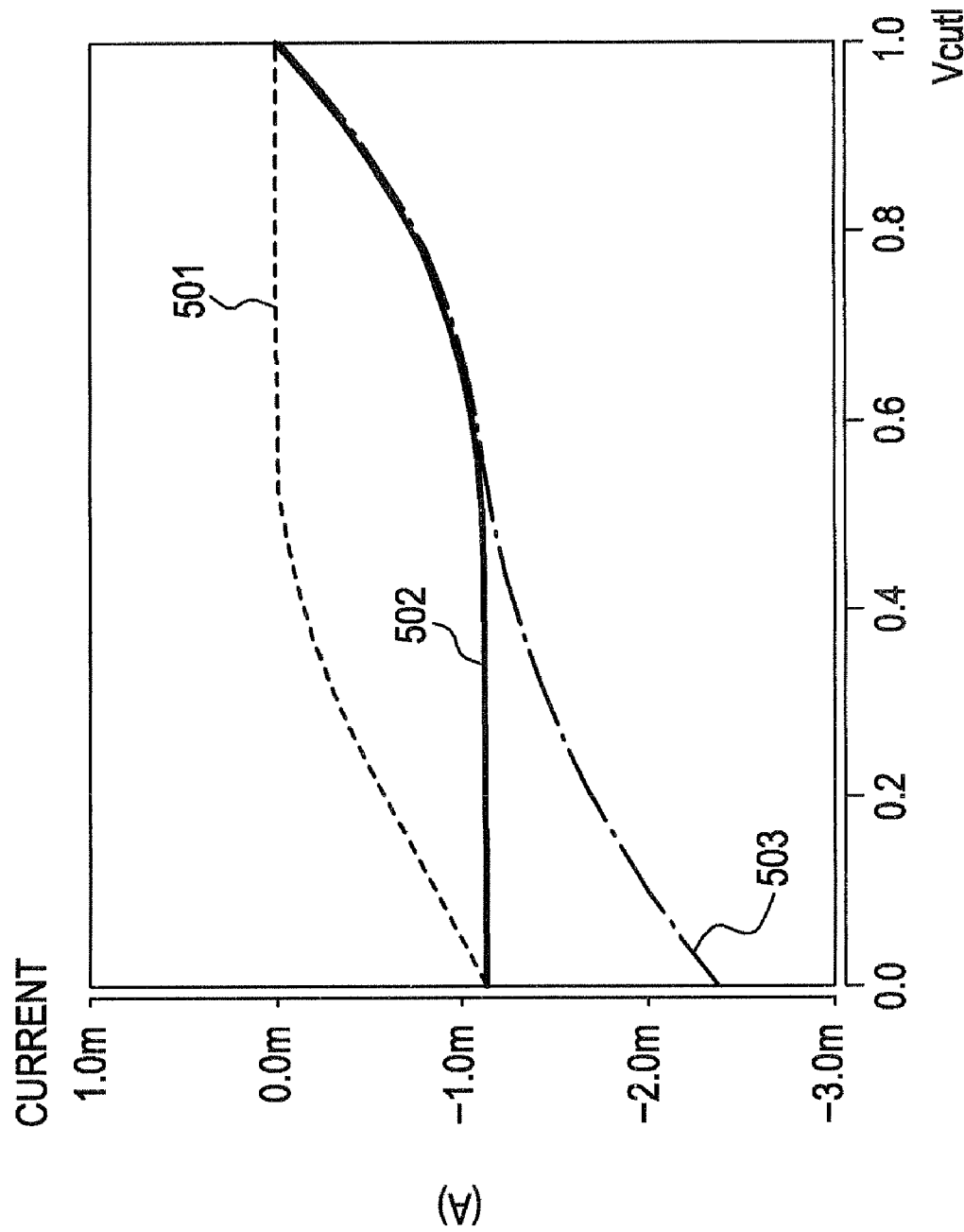
FIG. 5 is a diagram showing simulation results of an I-V characteristic of transistors in the low-pass filter.

FIG. 5 is a diagram showing simulation results of the I-V characteristic of the transistors M1 and M2 in the low-pass filter 103. A horizontal axis represents the control voltage Vcntl and a vertical axis represents the current flowing through the transistors M1 and M2. Note that the current is indicated by a current in a negative direction with reference to zero. A characteristic 501 represents a current flowing through the transistor M1. A characteristic 502 represents a current flowing through the transistor M2. An I-V characteristic 503 represents the sum of the currents flowing through the transistors M1 and M2. It can be seen that the I-V characteristic 503 substantially reproduces the required I-V characteristic 401 in FIG. 4.

In accordance with aspects of the present embodiment, since feedback control is not performed, normal transfer function calculation can be applied and thus the stability of the PLL circuit is not affected. A VCO gain correction is performed by the combined resistor RL instead of by a charge pump current. Also, by two transistors M1 and M2, the VCO gain can be easily corrected in an analog manner.

Furthermore, in accordance with aspects of the present embodiment, since a correction is not performed using a digital circuit, an initial sequence, a reset operation, etc., are not required and even when, for example, an instantaneous power interruption occurs, self-recovery can be performed. Also, in accordance with aspects of the present embodiment, since a redundant circuit (an amplifier, etc.) in the voltage-controlled oscillator 104 is not required, the jitter characteristic of the voltage-controlled oscillator 104 itself can be reduced. As a result, the PLL circuit can maintain low jitter over the entire lock range.

Figure 6:
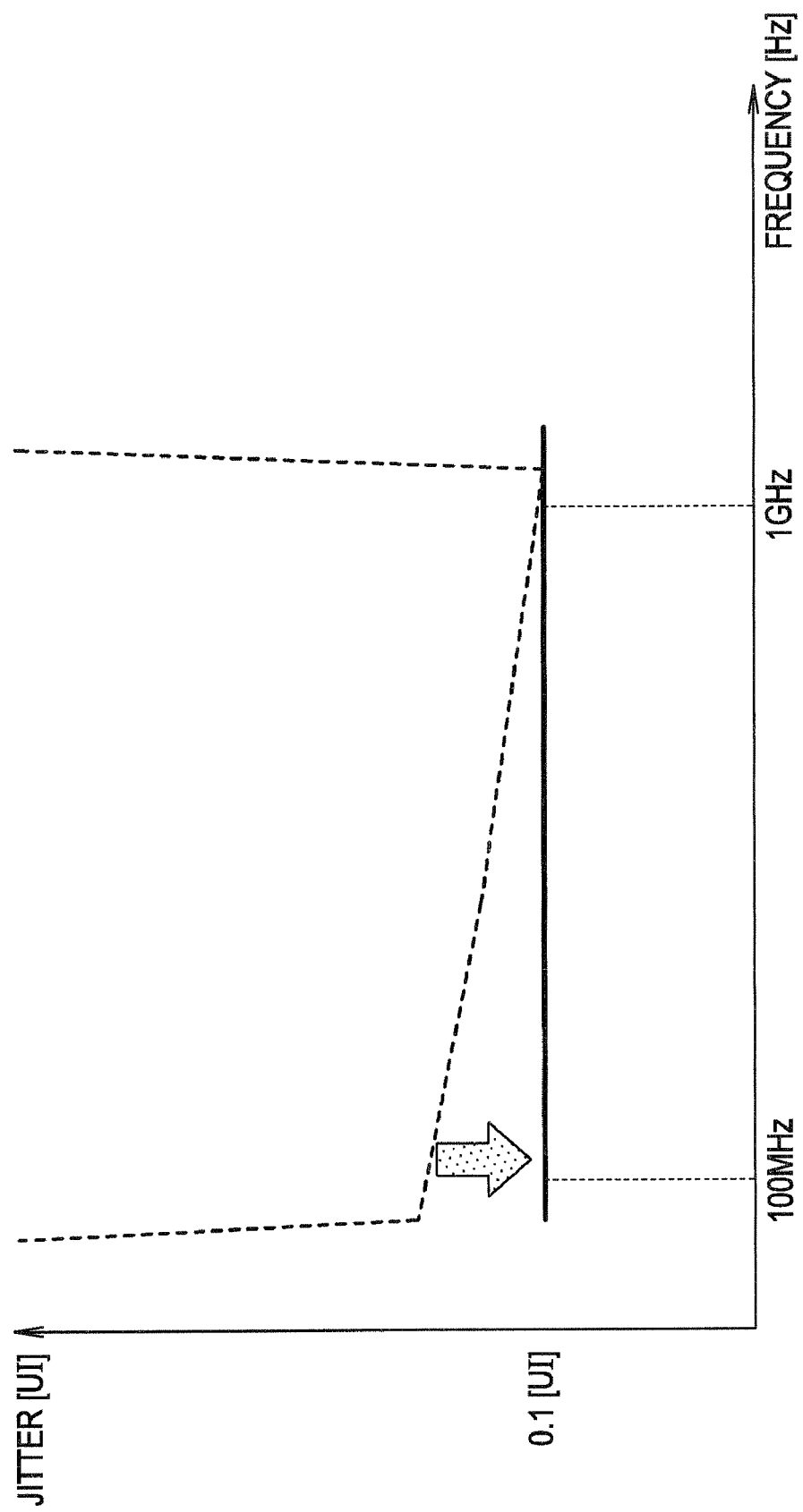
FIG. 6 is a diagram showing jitter characteristics relative to frequency, according to aspects of the first embodiment.

FIG. 6 is a diagram showing jitter characteristics relative to frequency, according to aspects of the present embodiment. Even when the frequency decreases and the VCO gain decreases, the combined resistor RL fluctuates in accordance with an operating point, and thus, in terms of the cutoff frequency (loop band), a constant value is maintained.

Second Embodiment

Figure 7:
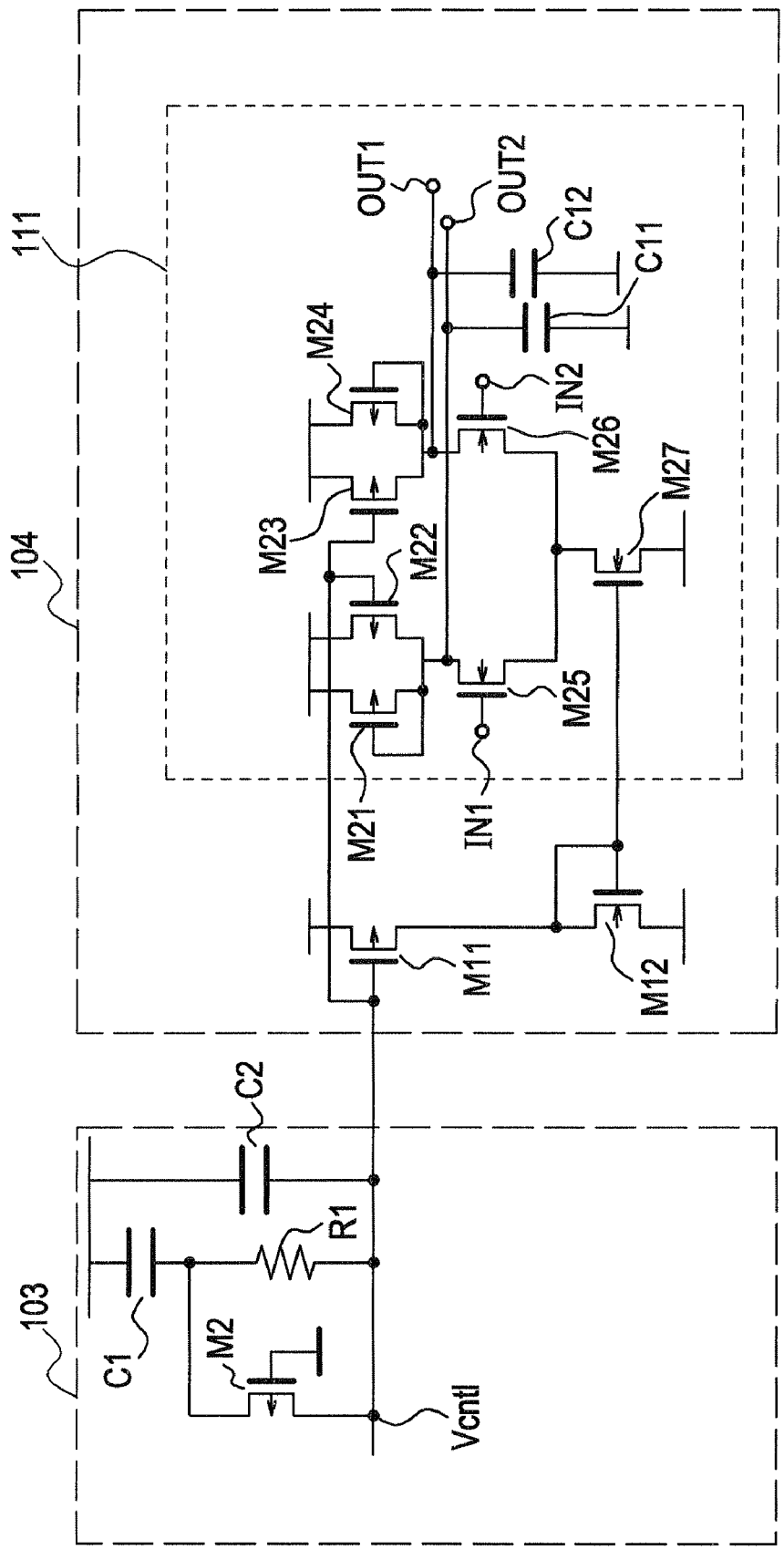
FIG. 7 is a circuit diagram showing exemplary configurations of a low-pass filter and a voltage-controlled oscillator in a PLL circuit according to a second embodiment in accordance with aspects of the present invention.

FIG. 7 is a circuit diagram showing exemplary configurations of a low-pass filter 103 and a voltage-controlled oscillator 104 in a PLL circuit according to a second embodiment in accordance with aspects of the present invention. The present embodiment (FIG. 7) is different from the first embodiment (FIG. 1) in that the transistor M1 is removed. Differences between the present embodiment and the first embodiment will be described below. In the present embodiment, a variable resistor R2 is implemented only by a gate-grounded transistor M2. The transistor M2 can implement a secondary I-V characteristic, as will be described later with reference to FIG. 11. By the secondary I-V characteristic, fluctuations in VCO gain can be cancelled.

Third Embodiment

Figure 8:
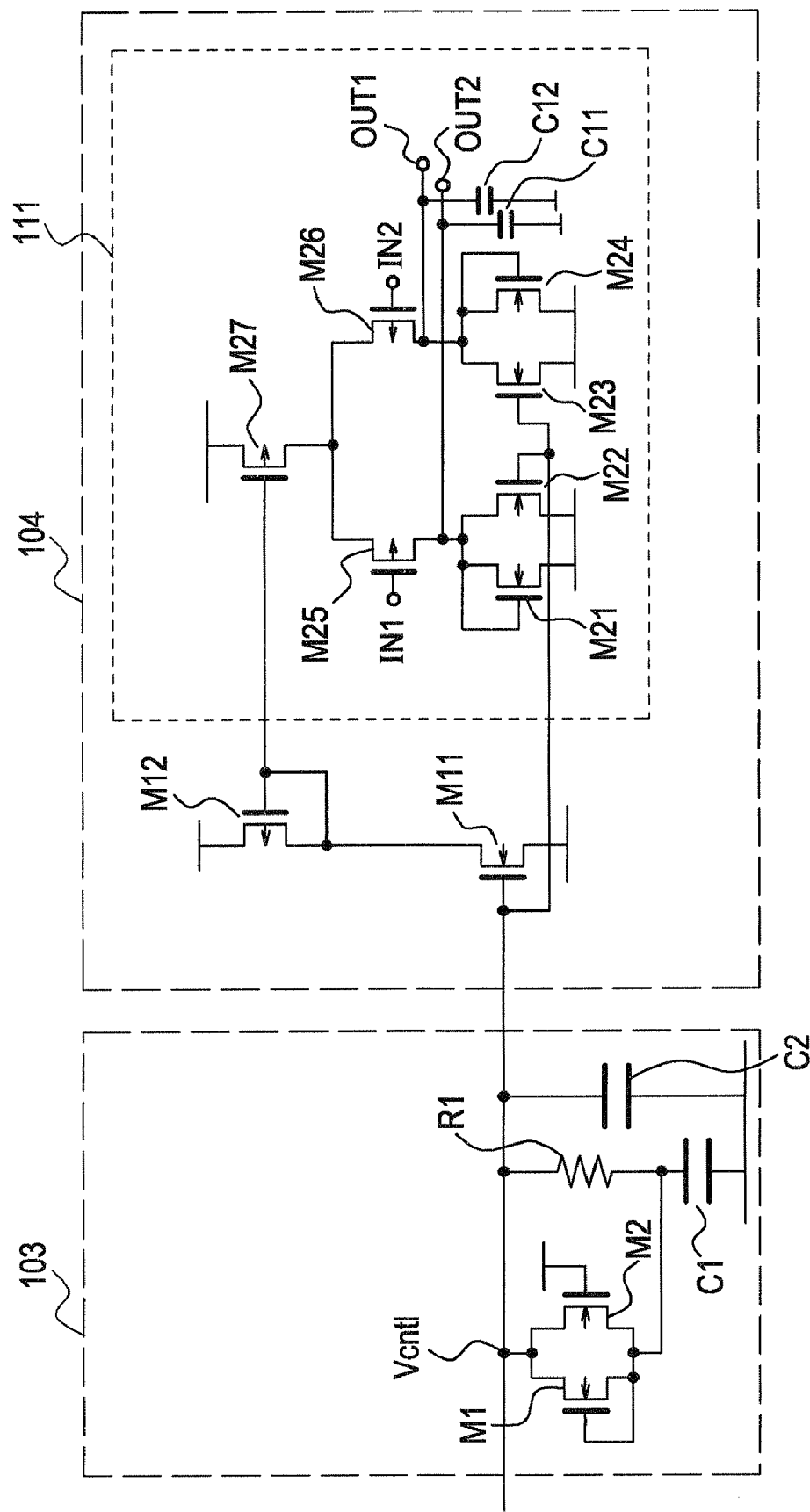
FIG. 8 is a circuit diagram showing exemplary configurations of a low-pass filter and a voltage-controlled oscillator in a PLL circuit according to a third embodiment in accordance with aspects of the present invention.

FIG. 8 is a circuit diagram showing exemplary configurations of a low-pass filter 103 and a voltage-controlled oscillator 104 in a PLL circuit according to a third embodiment in accordance with aspects of the present invention. In the first embodiment, an example is described in which the load transistors M21 to M24 in the voltage-controlled oscillator 104 each are composed of a p-channel transistor. In accordance with aspects of the present embodiment, an example will be described in which load transistors M21 to M24 in the voltage-controlled oscillator 104 each are composed of an n-channel transistor. Differences between the present embodiment and the first embodiment will be described below.

First, the configuration of the low-pass filter 103 will be described. The low-pass filter 103 has capacitors C1 and C2, a resistor R1, and transistors M1 and M2. A series-connected circuit including the capacitor C1 and the fixed resistor R1 is connected between a reference potential node and a node of a control voltage Vcntl. The capacitor C2 is connected between a reference potential node and a node of the control voltage Vcntl. The n-channel transistor M1 is connected, at its gate and source, to a point of interface between the capacitor C1 and the fixed resistor R1 and connected, at its drain, to a node of the control voltage Vcntl. To a gate of the n-channel transistor M2 is applied a bias voltage (e.g., a power supply voltage). The n-channel transistor M2 is connected, at its source, to the point of interface between the capacitor C1 and the fixed resistor R1 and connected, at its drain, to the node of the control voltage Vcntl. The transistor M1 is connected in parallel with the transistor M2 and is diode-connected. The fixed resistor R1 is connected between the sources and drains of the transistors M1 and M2.

Next, the configuration of the voltage-controlled oscillator 104 will be described. The voltage-controlled oscillator 104 has transistors M11 and M12 and four VCO units 111. The transistors M11 and M12 compose a bias circuit. The n-channel transistor M11 is connected, at its gate, to a node of the control voltage Vcntl and connected, at its source, to a reference potential node. The p-channel transistor M12 is connected, at its gate and drain, to a drain of the transistor M11 and connected, at its source, to a power supply voltage node.

The VCO units 111 each have transistors M21 to M27 and capacitors C11 and C12. The n-channel transistor M21 is connected, at its source, to a reference potential node and connected, at its gate and drain, to an output terminal OUT2. The n-channel transistor M22 is connected, at its gate, to a node of the control voltage Vcntl and connected, at its source, to a reference potential node and connected, at its drain, to the output terminal OUT2.

The n-channel transistor M23 is connected, at its gate, to the node of the control voltage Vcntl and connected, at its source, to a reference potential node and connected, at its drain, to an output terminal OUT1. The n-channel transistor M24 is connected, at is source, to a reference potential node and connected, at is gate and drain, to the output terminal OUT1.

The p-channel transistor M25 is connected, at its gate, to an input terminal IN1 and connected, at its drain, to the output terminal OUT2 and connected, at its source, to a drain of the p-channel transistor M27. The p-channel transistor M26 is connected, at its gate, to an input terminal IN2 and connected, at its drain, to the output terminal OUT1 and connected, at its source, to the drain of the p-channel transistor M27. The p-channel transistor M27 is connected, at its gate, to the gate of the transistor M12 and connected, at its source, to a power supply voltage node. The capacitor C11 is connected between the output terminal OUT2 and a reference potential node. The capacitor C12 is connected between the output terminal OUT1 and a reference potential node.

Fourth Embodiment

Figure 9:
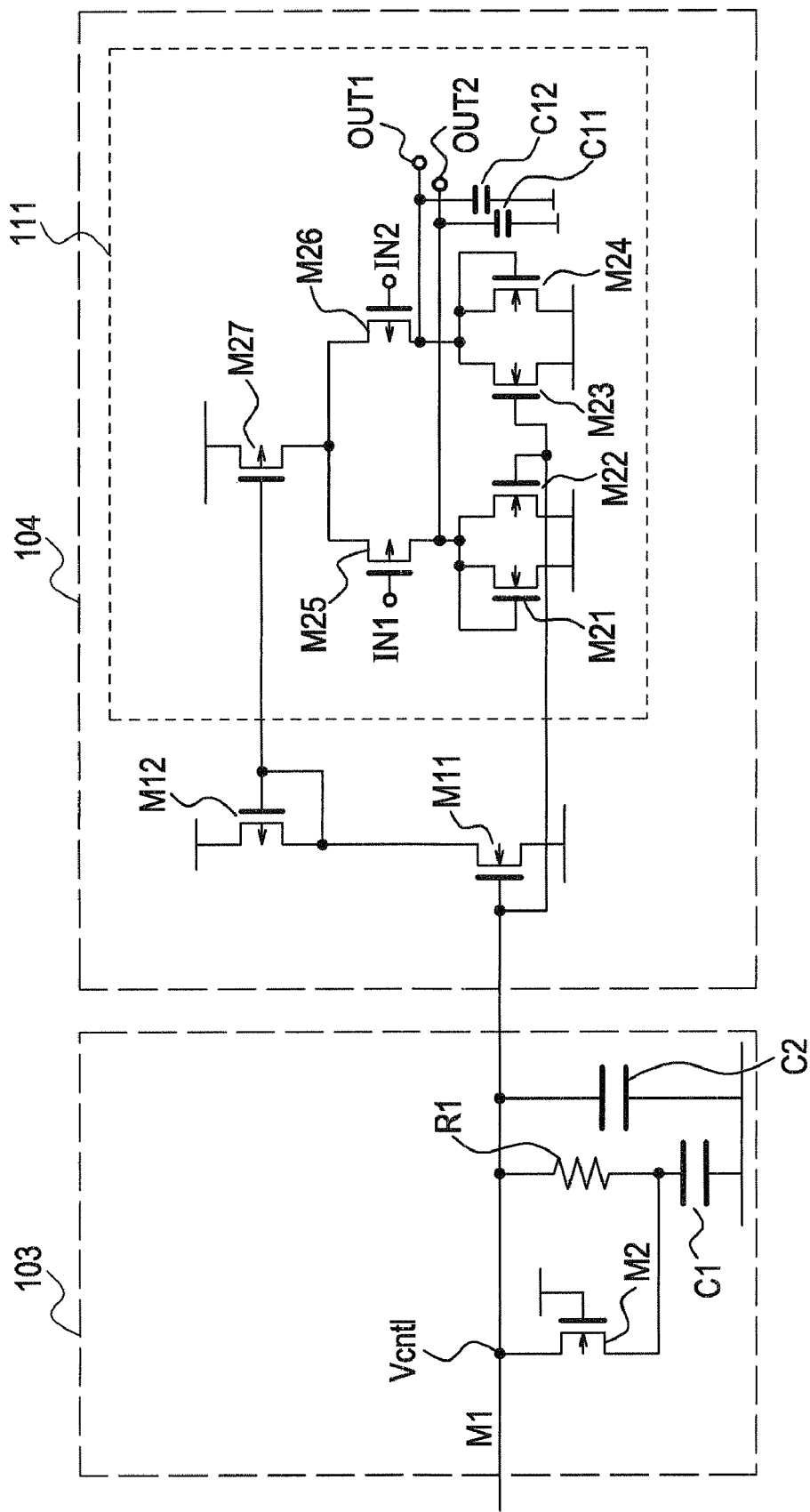
FIG. 9 is a circuit diagram showing exemplary configurations of a low-pass filter and a voltage-controlled oscillator in a PLL circuit according to a fourth embodiment in accordance with aspects of the present invention.

FIG. 9 is a circuit diagram showing exemplary configurations of a low-pass filter 103 and a voltage-controlled oscillator 104 in a PLL circuit according to a fourth embodiment in accordance with aspects of the present invention. The present embodiment (FIG. 9) is different from the third embodiment (FIG. 8) in that the transistor M1 is removed. Differences between the present embodiment and the third embodiment will be described below. In the present embodiment, a variable resistor R2 is implemented only by a gate-grounded transistor M2. The transistor M2 can implement a secondary I-V characteristic, as with the second embodiment. By the secondary I-V characteristic, fluctuations in VCO gain can be cancelled.

Fifth Embodiment

Figure 19:
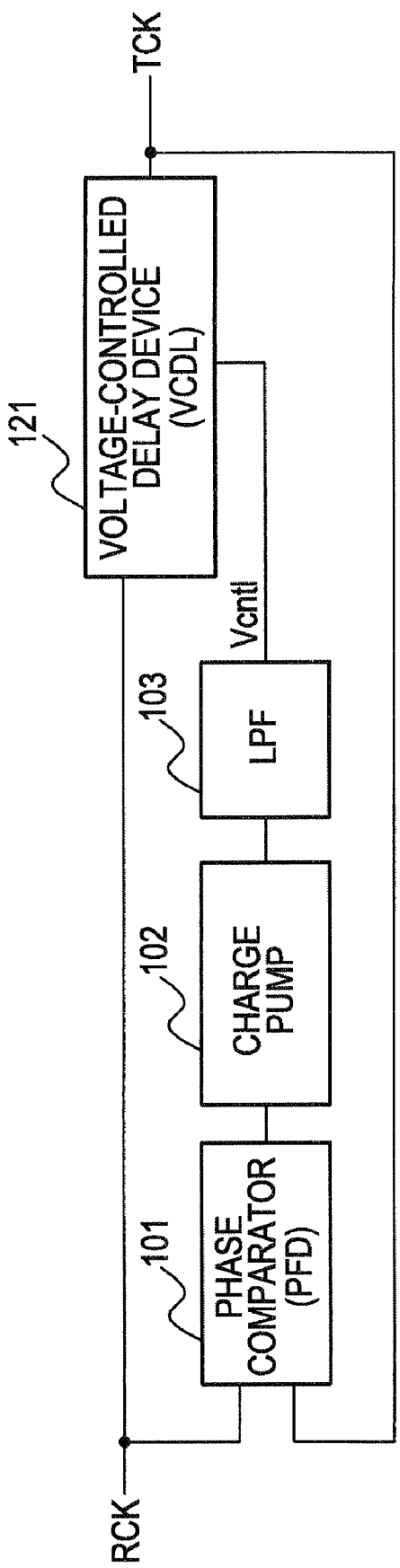
FIG. 19 is a block diagram showing an exemplary configuration of a delay-locked loop circuit.

FIG. 19 is a block diagram showing an exemplary configuration of a DLL circuit according to a fifth embodiment in accordance with aspects of the present invention. The DLL circuit has a phase comparator (PFD) 101, a charge pump 102, a low-pass filter (LPF) 103, and a voltage-controlled delay device (VCDL) 121.

The phase comparator 101 compares phases between a reference clock signal RCK and a feedback clock signal TCK and outputs a phase difference signal indicating a phase difference therebetween. For example, when the feedback clock signal TCK is advanced in phase with respect to the reference clock signal RCK the phase comparator 101 outputs a phase-advanced signal, and when the phase is delayed the phase comparator 101 outputs a phase-delayed signal. The phase-advanced signal and the phase-delayed signal are pulse signals having a pulse width according to a phase difference.

The charge pump 102 outputs a charge pump current according to the phase difference signal output from the phase comparator 101. For example, when a phase-delayed signal is input, the charge pump 102 withdraws a charge pump current from a capacitor in the low-pass filter 103 according to the pulse width of the phase-delayed signal to lower a control voltage Vcntl charged in the capacitor, and when a phase-advanced signal is input, the charge pump 102 supplies a charge pump current to a capacitor in the low-pass filer 103 according to the pulse width of the phase-advanced signal to raise a control voltage Vcntl charged in the capacitor.

The low-pass filter 103 includes a resistor and a capacitor and that smoothes the charge pump current output from the charge pump 102 and converts the smoothed current into a control voltage Vcntl. The control voltage Vcntl is a voltage of the capacitor in the low-pass filer 103.

The voltage-controlled delay device 121 generates a delay signal TCK by providing an amount of delay according to the control voltage Vcntl to the reference clock signal RCK and outputs the delay signal TCK to the phase comparator 101 as a feedback clock signal. For example, the voltage-controlled delay device 121 outputs a delay signal TCK provided with a longer amount of delay for a higher control voltage Vcntl. The delay signal TCK serves as an output clock signal.

By the above-described feedback control, control is performed in a direction in which the phase difference between the reference clock signal RCK and the feedback clock signal FCK becomes zero. As a result, when the phase difference in the phase comparator 101 becomes zero, the DLL circuit transitions to a lock state (steady state) and the output clock signal TCK becomes a clock signal that matches in phase the reference clock signal RCK.

Figure 20:
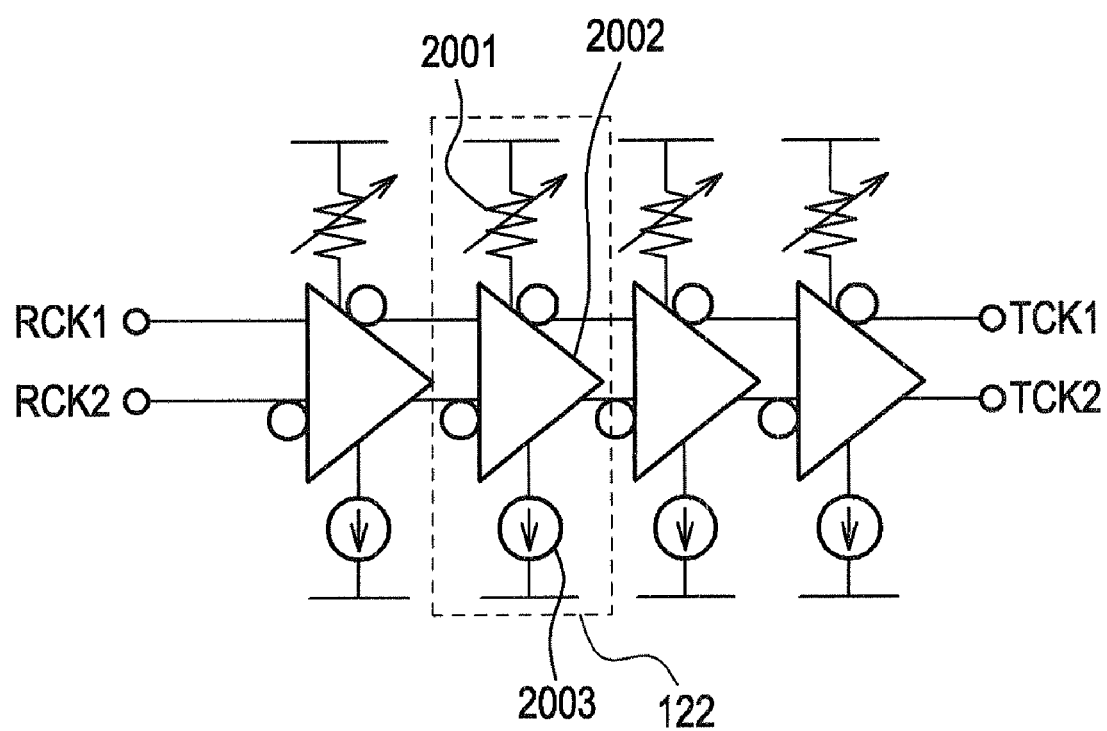
FIG. 20 is a circuit diagram showing an exemplary configuration of a voltage-controlled delay device in FIG. 19.
Figure 21:
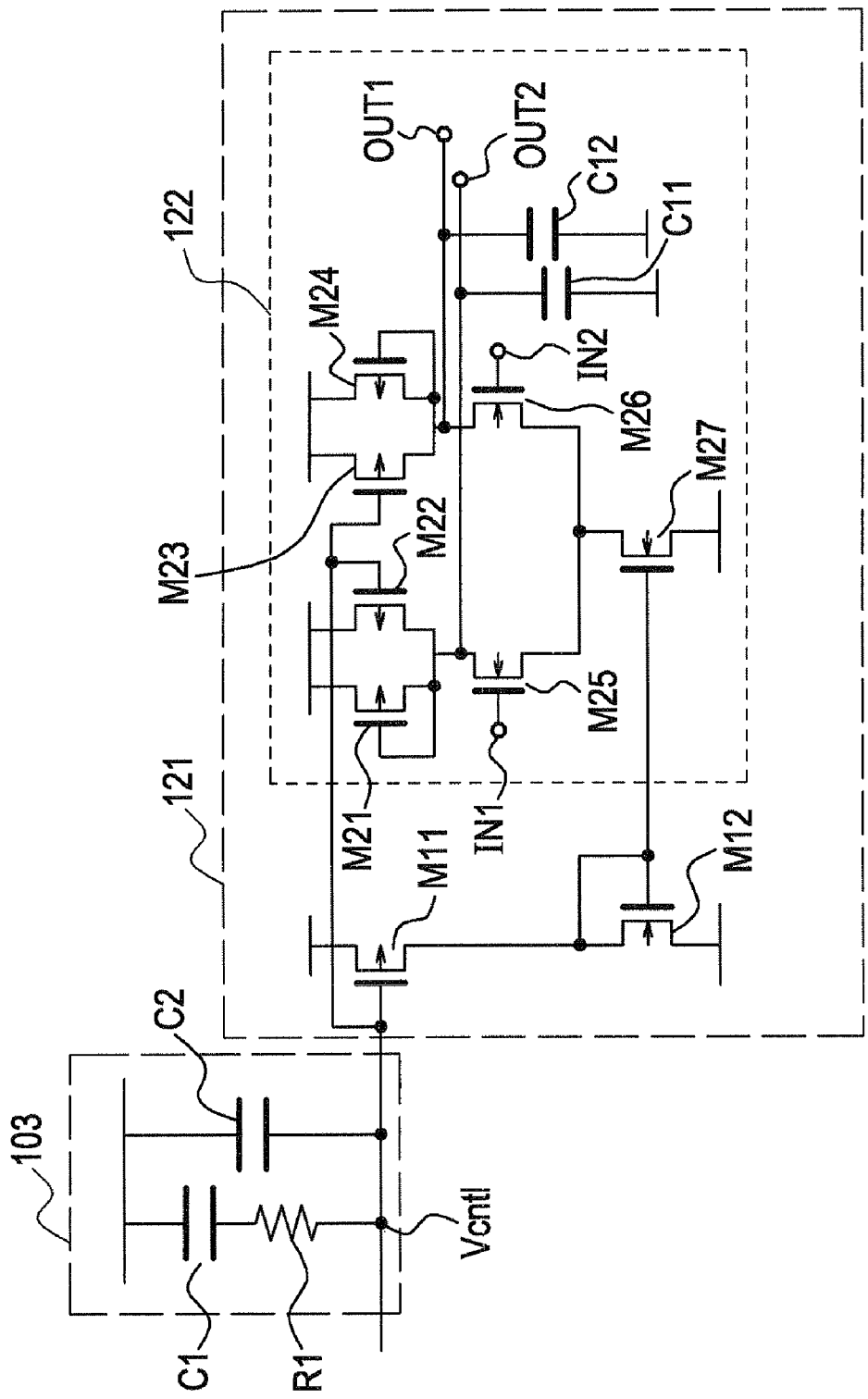
FIG. 21 is a circuit diagram showing exemplary configurations of a low-pass filter and the voltage-controlled delay device in FIG. 19.
Figure 22:
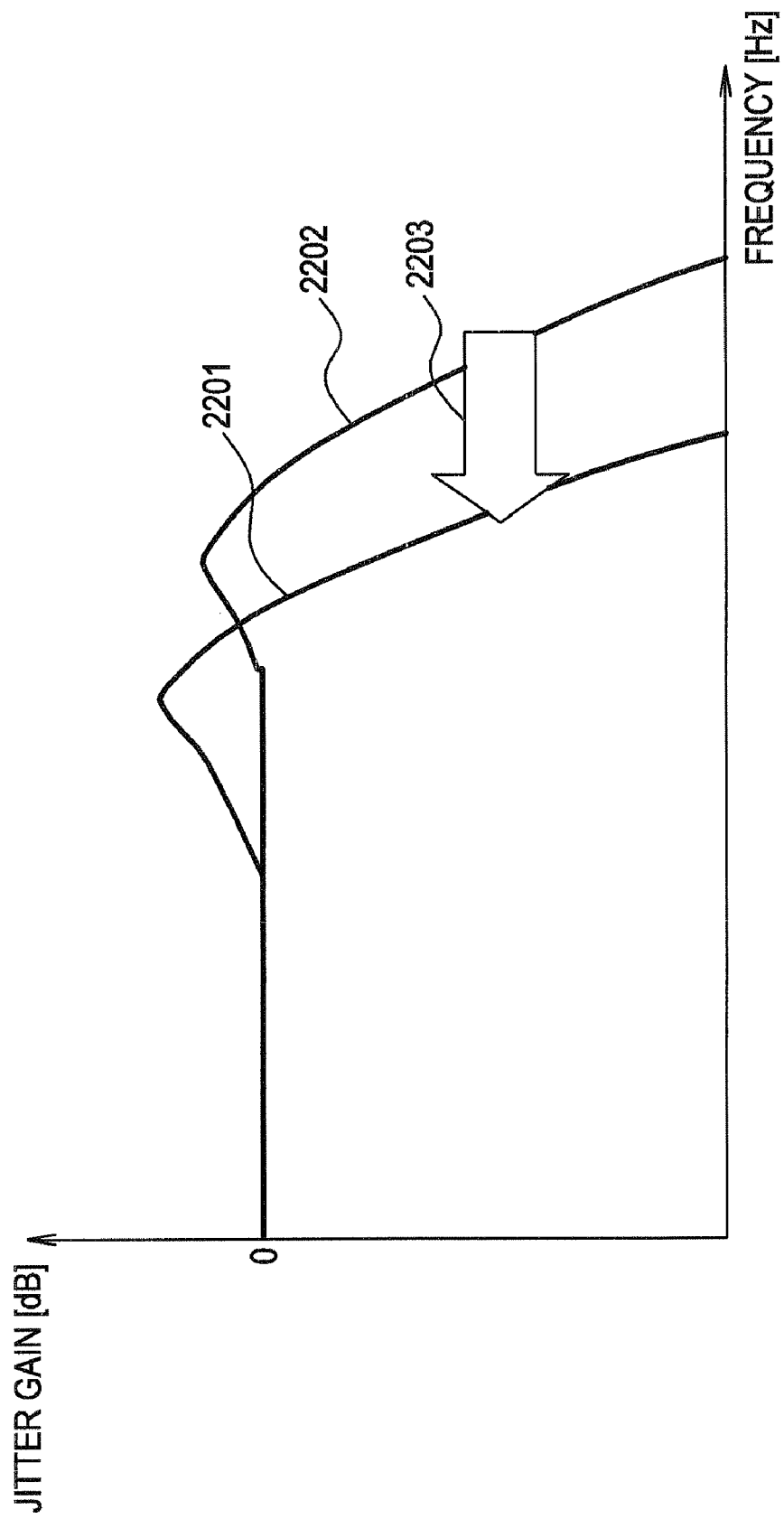
FIG. 22 is a diagram showing closed-loop functions of the PLL circuit and the DLL circuit.
Figure 23:
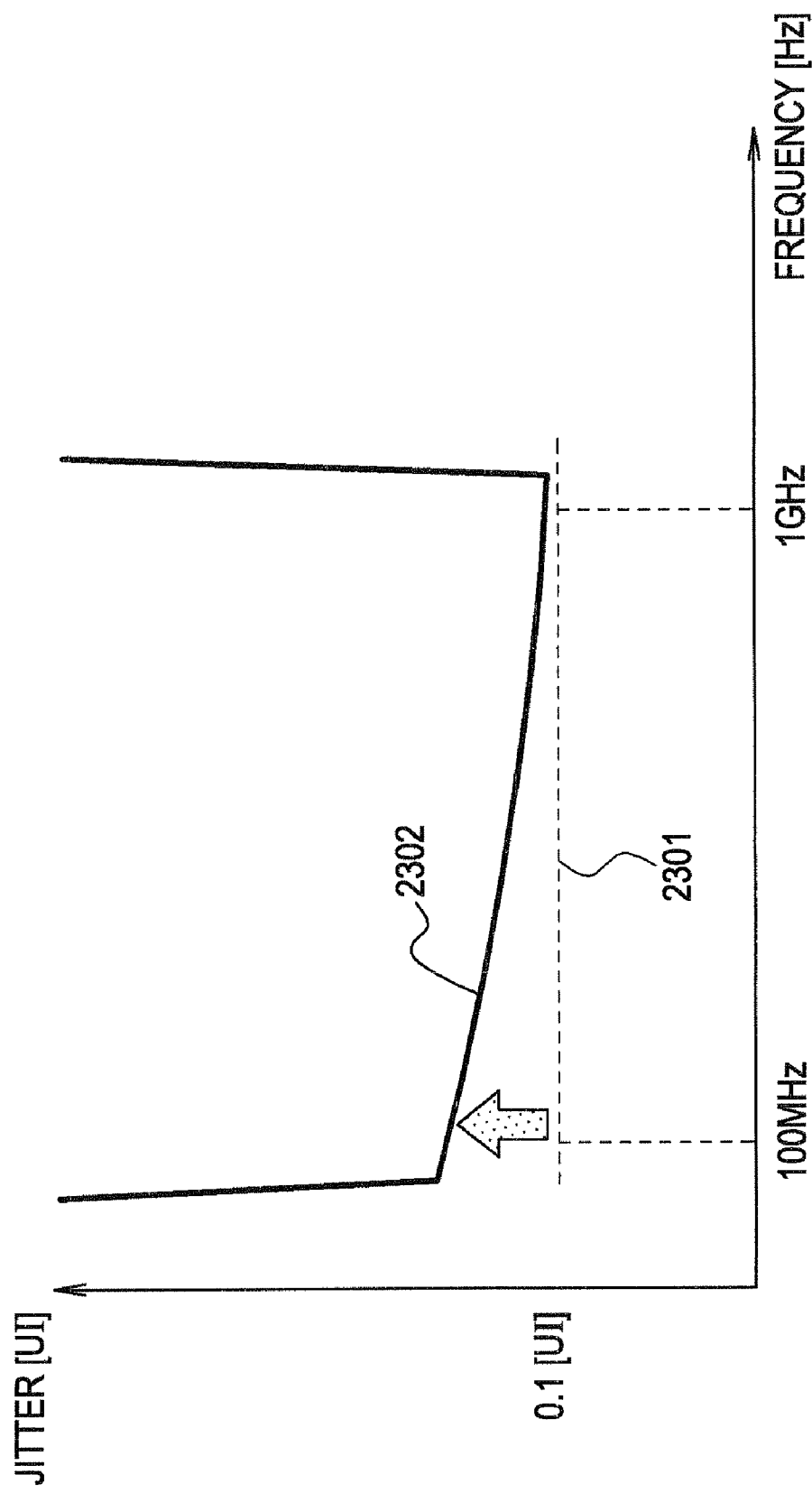
FIG. 23 is a diagram showing jitter characteristics relative to frequency.
Figure 24:
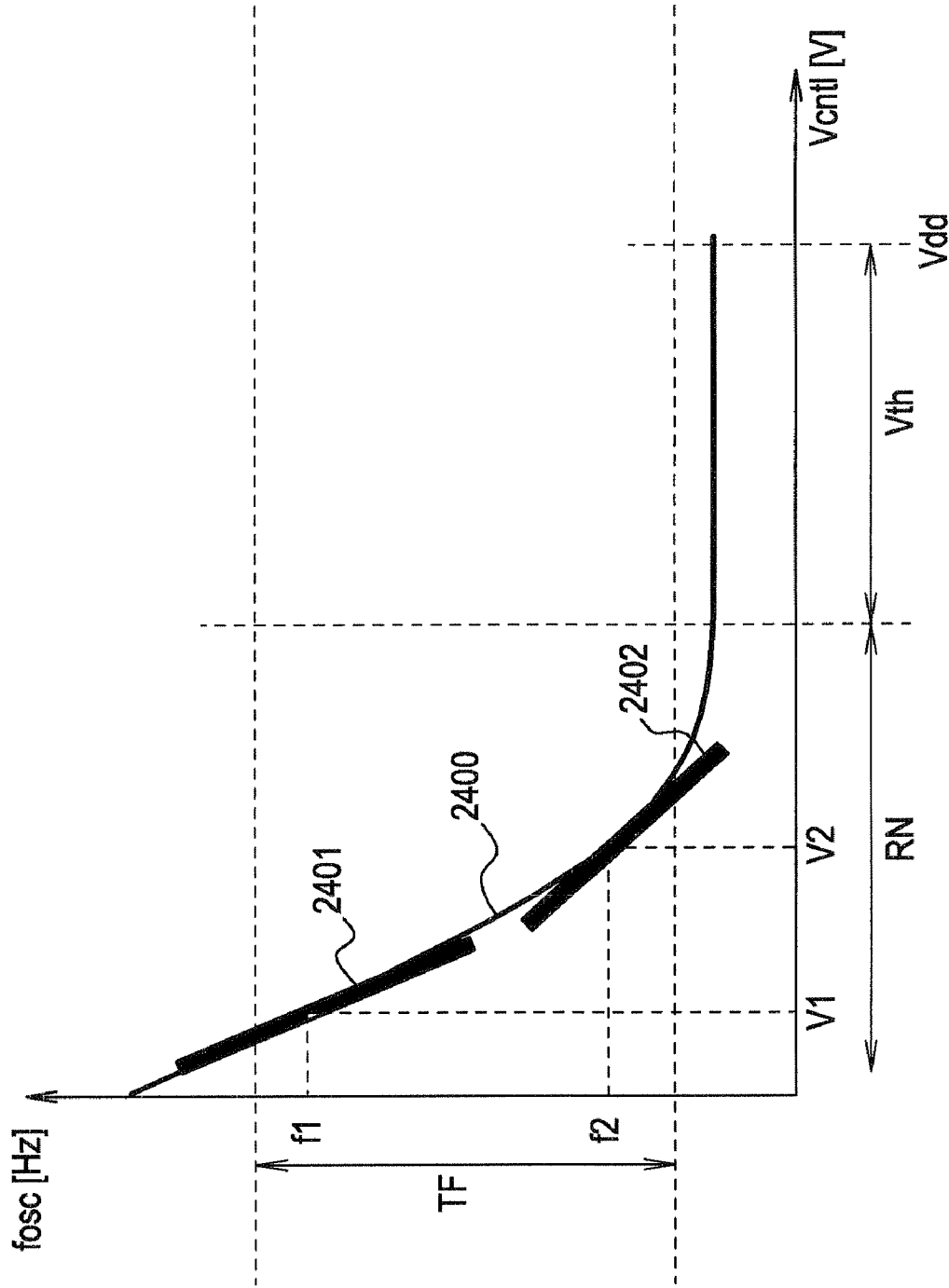
FIG. 24 is a diagram showing a control voltage-oscillation frequency characteristic of the voltage-controlled oscillator.

FIG. 20 is a circuit diagram showing an exemplary configuration of the voltage-controlled delay device 121 in FIG. 19. The voltage-controlled delay device 121 is, for example, a delay line having four VCDL units 122. The VCDL units 122 each have a variable resistor 2001, a differential amplifier 2002, and a current source 2003. The VCDL units 122 have the same configuration as the VCO units 111 in FIG. 17. Reference clock differential signals RCK1 and RCK2 are differential signals of the reference clock signal RCK in FIG. 19. Output clock differential signals TCK1 and TCK2 are differential signals of the output clock signal TCK in FIG. 19. To differential signal input terminals of a first-stage differential amplifier 2002 are, respectively, input the reference clock differential signals RCK1 and RCK2. Positive differential signal output terminals and negative differential signal output terminals of the first-to third-stage differential amplifiers 2002 are, respectively, connected to negative differential signal input terminals and positive differential signal input terminals of the second-to fourth-stage differential amplifiers 2002. A positive differential signal output terminal and a negative differential signal output terminal of the fourth-stage differential amplifier 2002 respectively output the output clock differential signals TCK1 and TCK2.

Figure 10:
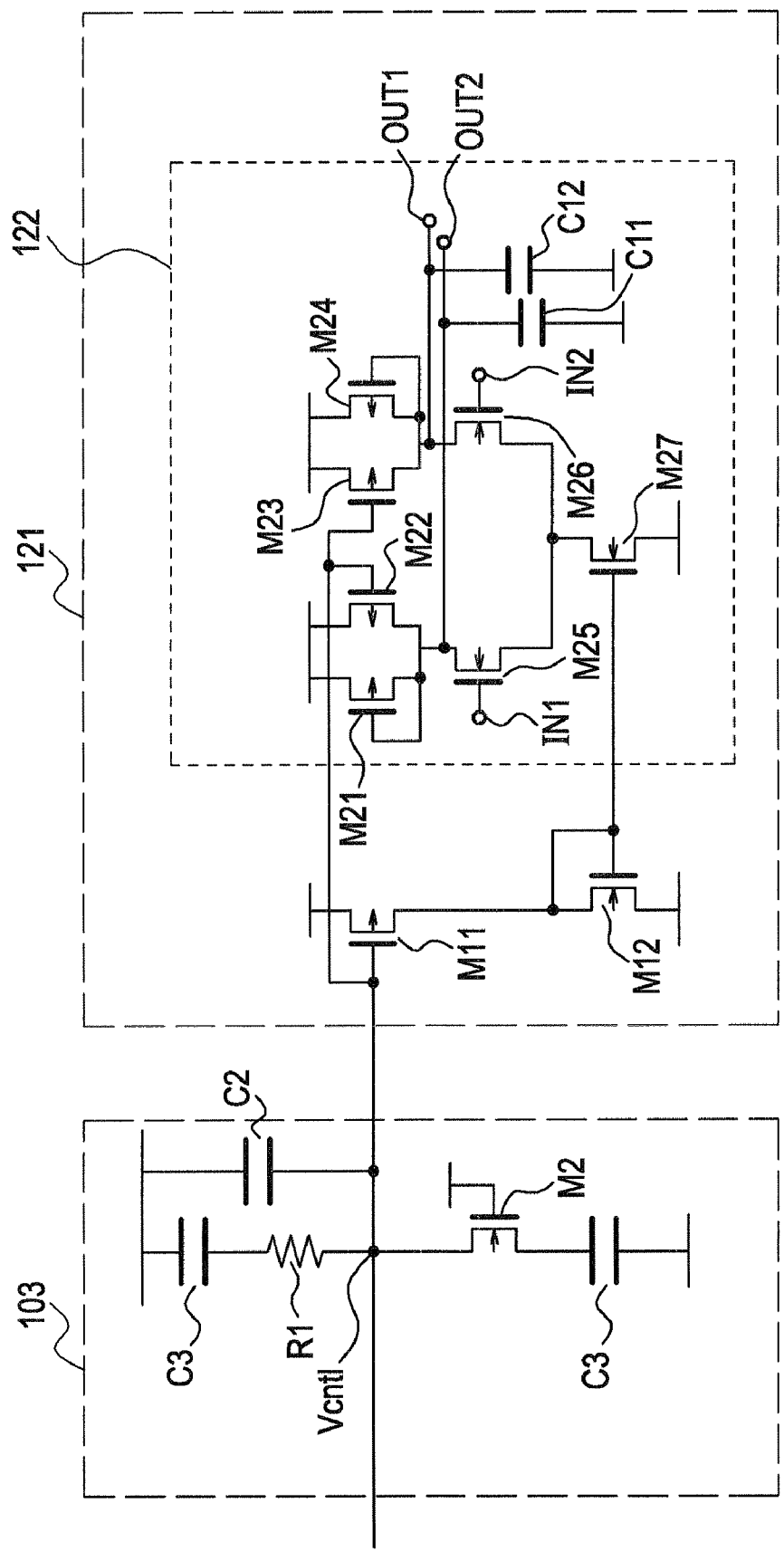
FIG. 10 is a circuit diagram showing exemplary configurations of a low-pass filter and a voltage-controlled delay device in a DLL circuit according to a fifth embodiment in accordance with aspects of the present invention.

FIG. 10 is a circuit diagram showing exemplary configurations of the low-pass filter 103 and the voltage-controlled delay device 121 in the DLL circuit according to aspects of the present embodiment. The low-pass filter 103 has capacitors C2 and C3, a fixed resistor R1, and a transistor M2. A series-connected circuit including one of the capacitors C3 and the fixed resistor R1 is connected between a power supply voltage node and a node of a control voltage Vcntl. The capacitor C2 is connected between a power supply voltage node and a node of the control voltage Vcntl. To a gate of the n-channel transistor M2 is applied a bias voltage (e.g., a power supply voltage). The n-channel transistor M2 is connected, at its source, to a reference potential node through the other capacitor C3 and connected, at its drain, to the node of the control voltage Vcntl. Note that the capacitors C3 each have a capacitance value that is half that of the capacitor C1 in FIG. 1.

The voltage-controlled delay device 121 has transistors M11 and M12 and four VCDL units 122. The transistors M11 and M12 have the same configuration as the transistors M11 and M12 in FIG. 1. The VCDL unit 122 has the same configuration as the VCO unit 111 in FIG. 1. The four VCDL units 122 are connected in series, as shown in FIG. 20.

The voltage-controlled delay device 121 has load transistors M21 to M24 composing a load. The transistor M2 has the same channel length and the same channel width as the load transistors M21 to M24 and has a different number of parallel transistors than the load transistors M21 to M24.

Figure 25:
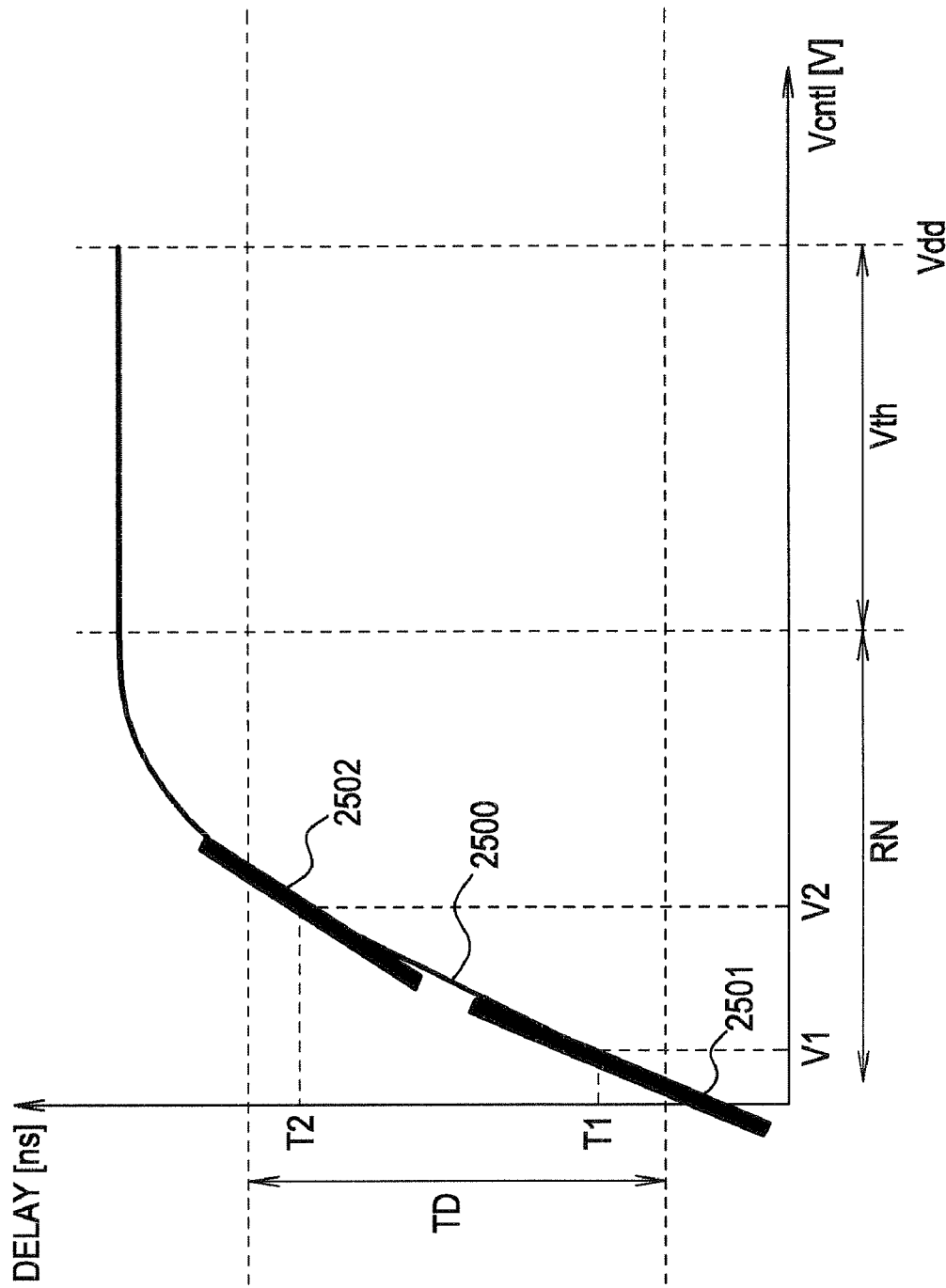
FIG. 25 is a diagram showing a control voltage-amount of delay characteristic of the voltage-controlled delay device.

In the present embodiment, too, as with the first embodiment, the fluctuations in VCDL gain in FIG. 25 are cancelled by a combined resistor in the low-pass filter 103. Differences between the present embodiment and the first embodiment will be described below.

In the present embodiment, the transistor M2 is provided in the low-pass filter 103. The transistor M2 is structured to have the same channel width and the same channel length as the load transistors M21 to M24 of the voltage-controlled delay device 121 to adjust the number of parallel transistors. The amount of fluctuation in VCDL gain is determined by the band to be used. The characteristic of this structure is that the VCDL gain is cancelled by the resistance value of the low-pass filter 103. As shown in the following equation, a VCDL gain Kd is proportional to the square of the control voltage Vcntl.

$$Kd = Cr/\{2 \times \beta \times (Vcntl - Vth)^2\}$$

Hence, by inserting a transistor resistor having a secondary characteristic with respect to the control voltage Vcntl, variations in VCDL gain are cancelled. Since the gate voltage of the transistor M2 in the low-pass filter 103 is fixed to the power supply voltage, the control voltage Vcntl dependence cannot be completely reflected. However, since the gate voltage is sufficiently applied, the transistor M2 can determine an I-V characteristic by drain voltage dependence. By using this characteristic, the transistor M2 is used as a resistor.

Figure 26:
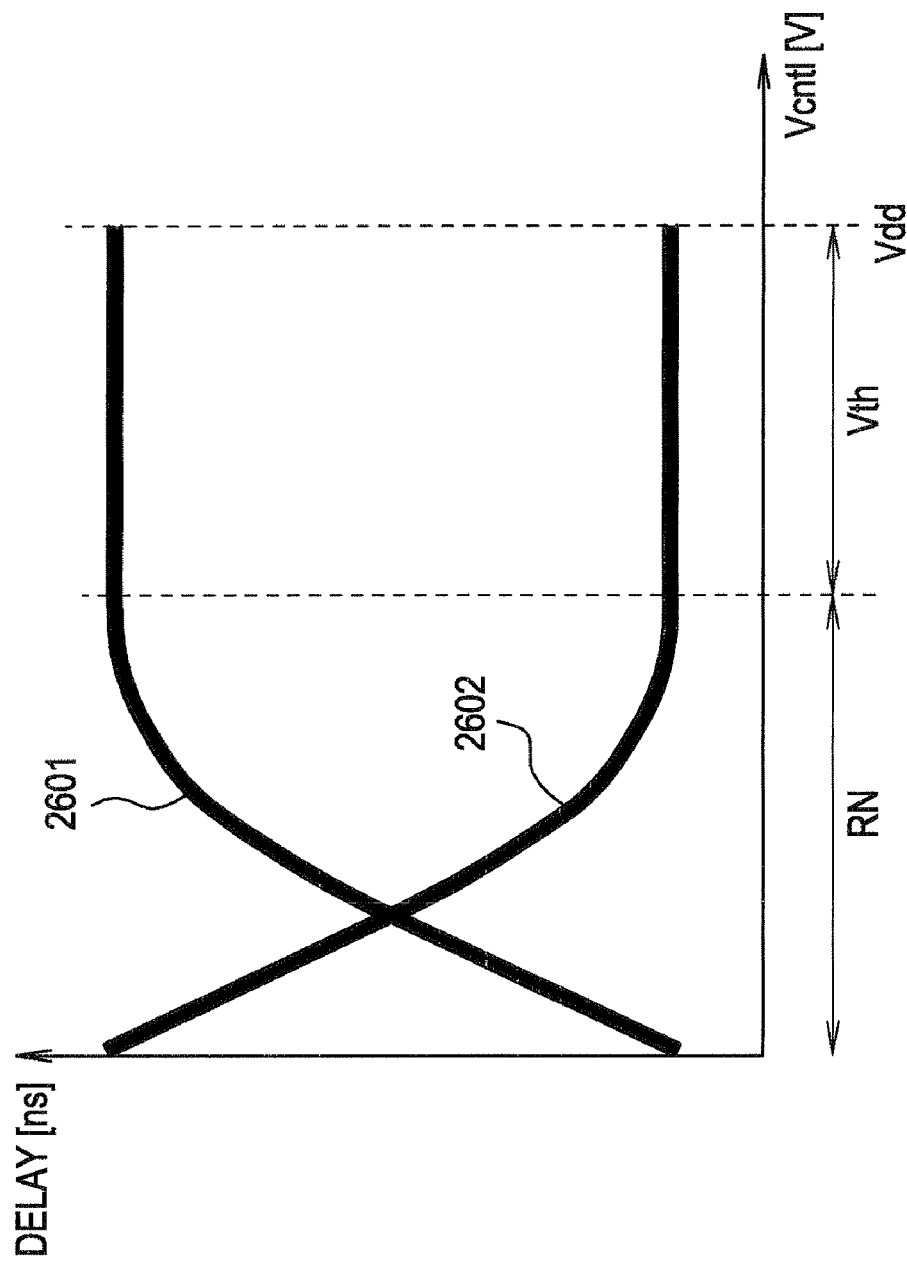
FIG. 26 is a diagram showing a relationship between the control voltage and the amount of delay of the voltage-controlled delay device.

FIG. 26 is a diagram showing a relationship between the control voltage Vcntl and the amount of delay of the voltage-controlled delay device 121 and corresponds to FIG. 25. The DLL circuit can lock in a tuning range RN. Vdd represents the power supply voltage and Vth represents the threshold voltage of transistors. A characteristic 2601 represents an I-V characteristic required for the transistor M2 in the low-pass filter 103. The I-V characteristic 2601 preferably has a secondary slope proportional to the control voltage Vcntl and ideally matches the characteristic 2500 in FIG. 25. To implement the I-V characteristic 2601, a combined-resistor characteristic 2602 is required. The combined-resistor characteristic 2602 is a characteristic of a combined resistor RL relative to the control voltage Vcntl. Given that the resistor of the transistor M2 is R2, the combined resistor RL is represented by R1×R2/(R1+R2). The resistor R2 is a variable resistor according to the control voltage Vcntl. In the case of the DLL circuit, performing a correction by a secondary linear curve increases cancellation accuracy. Even when cancellation is performed by a primary characteristic in the DLL circuit, though cancellation error occurs, there is, of course, an effect as compared with the case of not performing a correction.

The low-pass filter 103 has the variable resistor R2 that is changed according to the control voltage Vcntl. The variable resistor R2 has the transistor M2 having a drain to which the control voltage Vcntl is applied.

When the amount of delay is large, the VCDL gain is high, the control voltage Vcntl is high, the variable resistor R2 is high, the combined resistor RL is low, and thus fluctuations in cutoff frequency BW can be prevented. On the other hand, when the amount of delay is small, the VCDL gain is low, the control voltage Vcntl is low, the variable resistor R2 is low, the combined resistor RL is high, and thus fluctuations in cutoff frequency BW can be prevented.

Figure 11:
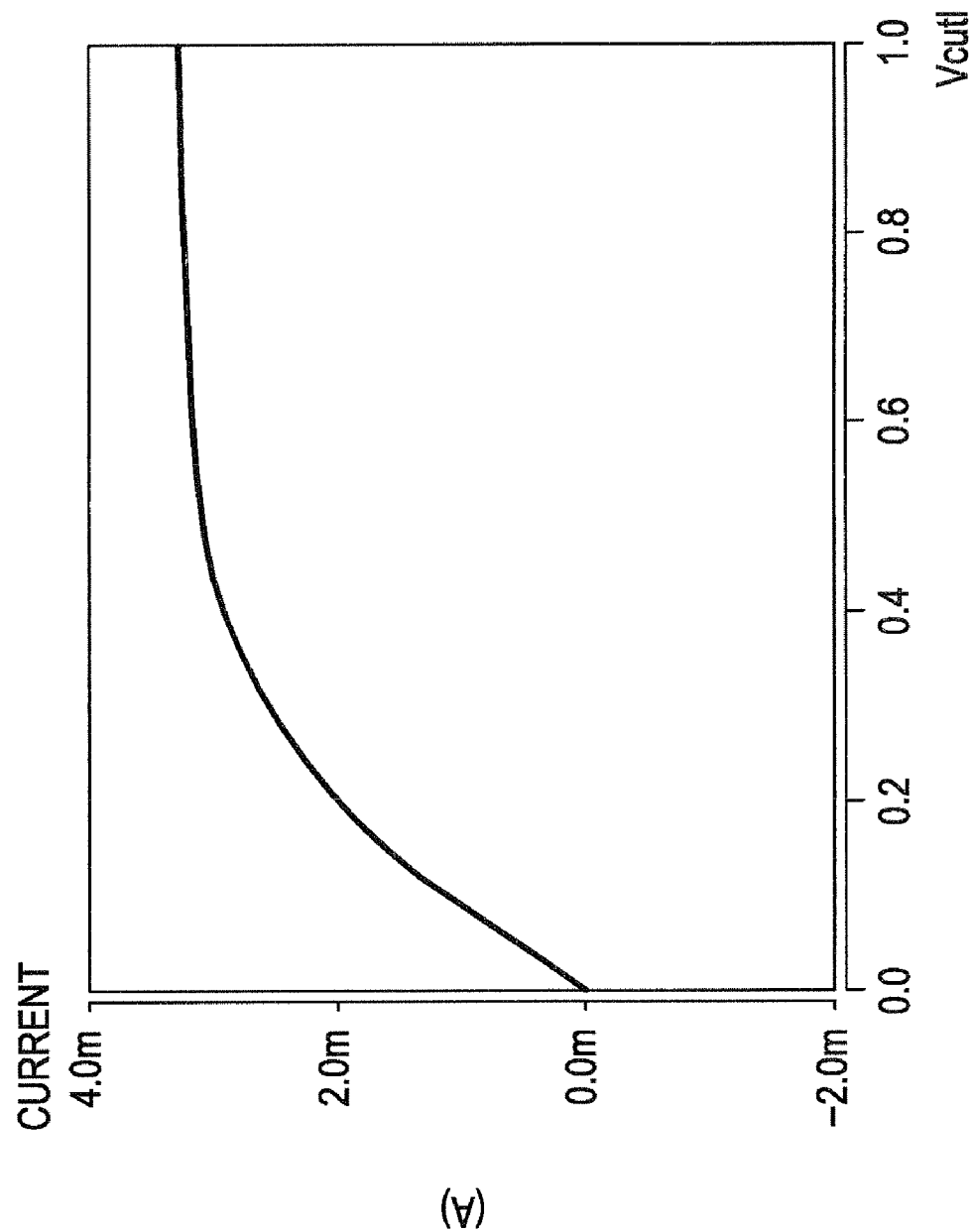
FIG. 11 is a diagram showing a simulation result of an I-V characteristic of a transistor in the low-pass filter.

FIG. 11 is a diagram showing a simulation result of the I-V characteristic of the transistor M2 in the low-pass filter 103. A horizontal axis represents the control voltage Vcntl and a vertical axis represents the current flowing through the transistor M2. It can be seen that the I-V characteristic substantially reproduces the required I-V characteristic 2601 in FIG. 26.

In the present embodiment, since feedback control is not performed, normal transfer function calculation can be applied and thus the stability of the DLL circuit is not affected. A VCDL gain correction is performed by the combined resistor RL instead of by a charge pump current. Also, by one transistor M2, the VCDL gain can be easily corrected in an analog manner. As with FIG. 6, jitter can be reduced.

Sixth Embodiment

Figure 12:
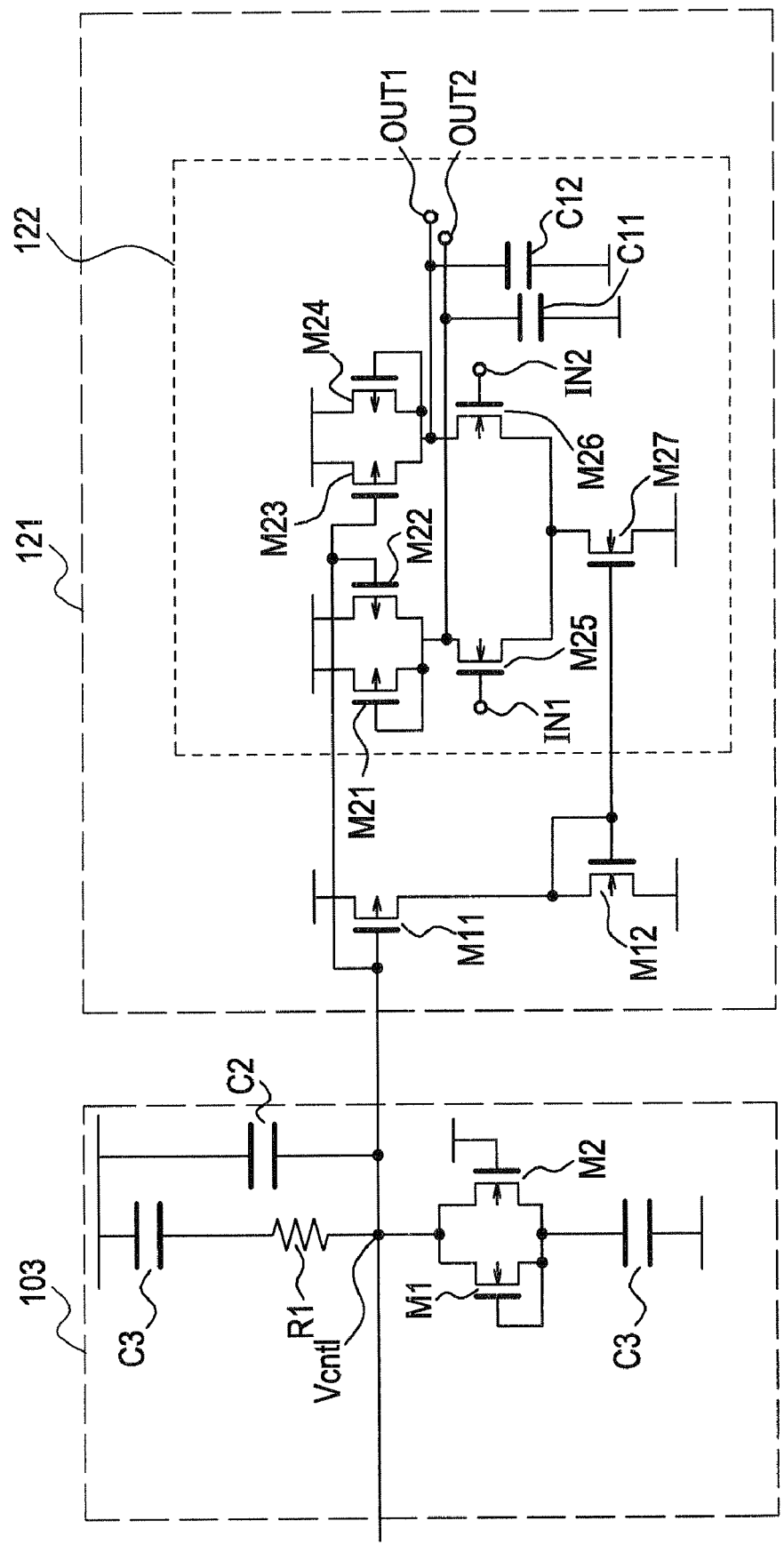
FIG. 12 is a circuit diagram showing exemplary configurations of a low-pass filter and a voltage-controlled delay device in a DLL circuit according to a sixth embodiment in accordance with aspects of the present invention.

FIG. 12 is a circuit diagram showing exemplary configurations of a low-pass filter 103 and a voltage-controlled delay device 121 in a DLL circuit according to a sixth embodiment in accordance with aspects of the present invention. The present embodiment (FIG. 12) is different from the fifth embodiment (FIG. 10) in that a transistor M1 is added. Differences between the present embodiment and the fifth embodiment will be described below. The n-channel transistor M1 is connected, at its drain, to a drain of a transistor M2 and connected, at its gate and source, to a source of the transistor M2. The transistor M1 is diode-connected and is connected in parallel with the transistor M2. The transistors M1 and M2 can implement a primary I-V characteristic, as with the first embodiment. By the primary I-V characteristic, fluctuations in VCDL gain can be cancelled.

The voltage-controlled delay device 121 has load transistors M21 to M24 composing a load. The transistors M1 and M2 have the same channel length and the same channel width as the load transistors M21 to M24 and have a different number of parallel transistors than the load transistors M21 to M24.

Seventh Embodiment

Figure 13:
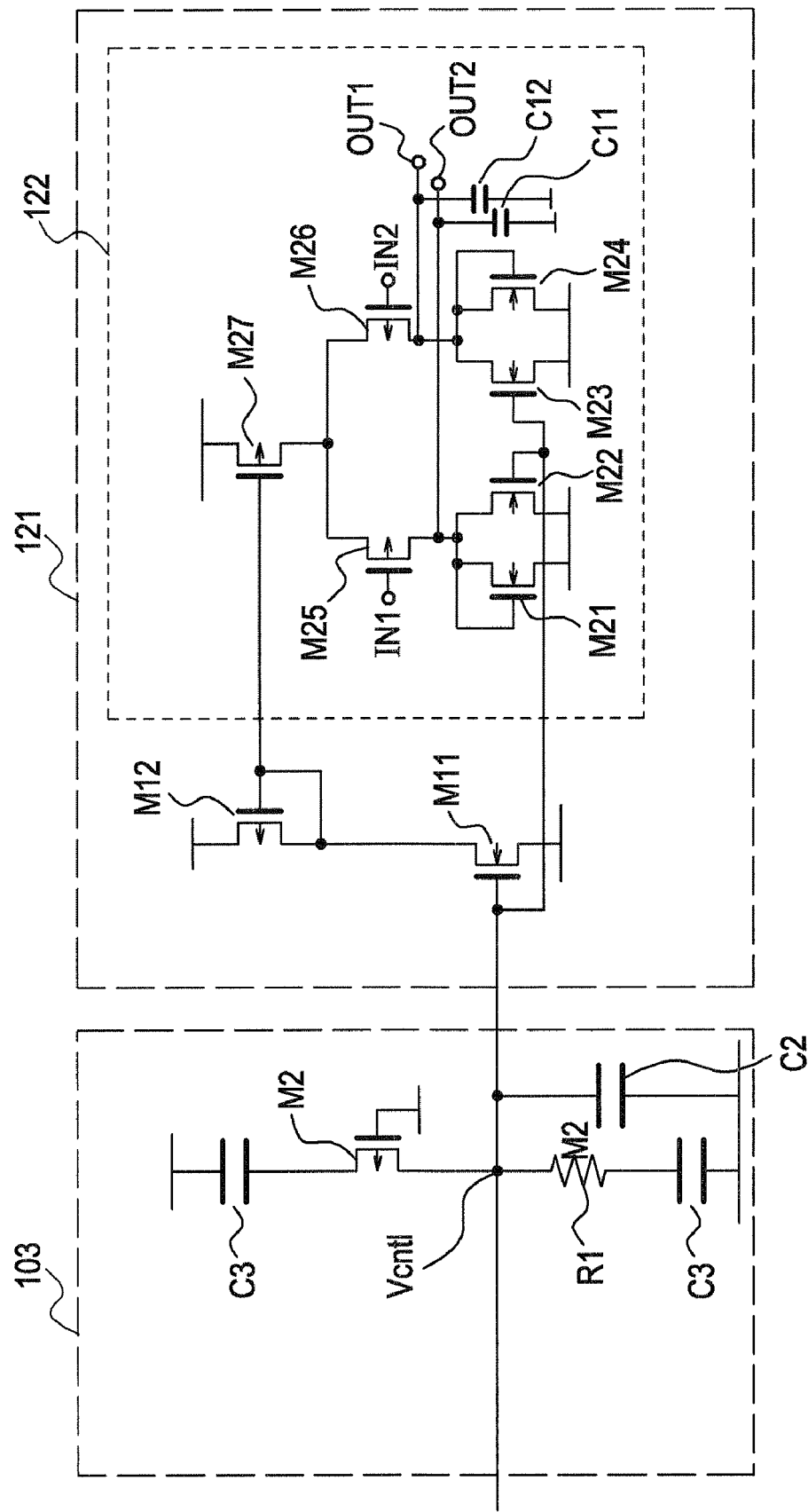
FIG. 13 is a circuit diagram showing exemplary configurations of a low-pass filter and a voltage-controlled delay device in a DLL circuit according to a seventh embodiment in accordance with aspects of the present invention.

FIG. 13 is a circuit diagram showing exemplary configurations of a low-pass filter 103 and a voltage-controlled delay device 121 in a DLL circuit according to a seventh embodiment in accordance with aspects of the present invention. In the fifth embodiment, an example is described in which the load transistors M21 to M24 in the voltage-controlled delay device 121 each are composed of a p-channel transistor. In the present embodiment, an example will be described in which load transistors M21 to M24 in the voltage-controlled delay device 121 each are composed of an n-channel transistor. Differences between the present embodiment and the fifth embodiment will be described below.

The low-pass filter 103 has capacitors C2 and C3, a fixed resistor R1, and a transistor M2. A series-connected circuit including one of the capacitors C3 and the fixed resistor R1 is connected between a reference potential node and a node of a control voltage Vcntl. The capacitor C2 is connected between a reference potential node and a node of the control voltage Vcntl. To a gate of the p-channel transistor M2 is applied a bias voltage (e.g., a reference potential). The p-channel transistor M2 is connected, at its source, to a power supply voltage node through the other capacitor C3 and connected, at its drain, to the node of the control voltage Vcntl.

Transistors M11 and M12 in the voltage-controlled delay device 121 have the same configuration as the transistors M11 and M12 in FIG. 8. A VCDL unit 122 has the same configuration as the VCO unit 111 in FIG. 8.

Eighth Embodiment

Figure 14:
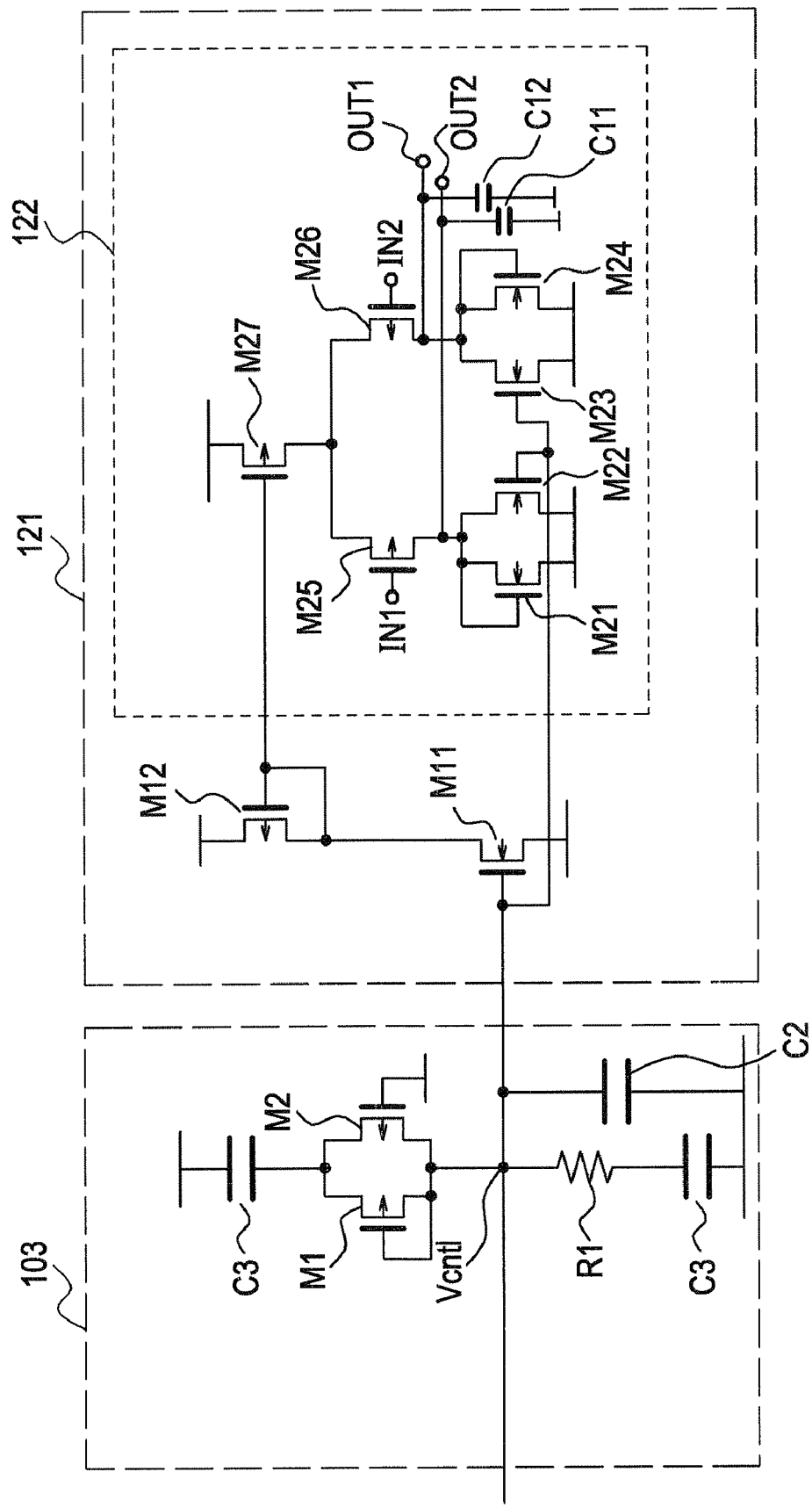
FIG. 14 is a circuit diagram showing exemplary configurations of a low-pass filter and a voltage-controlled delay device in a DLL circuit according to an eighth embodiment in accordance with aspects of the present invention.

FIG. 14 is a circuit diagram showing exemplary configurations of a low-pass filter 103 and a voltage-controlled delay device 121 in a DLL circuit according to an eighth embodiment in accordance with aspects of the present invention. The present embodiment (FIG. 14) is different from the seventh embodiment (FIG. 13) in that a transistor M1 is added. Differences between the present embodiment and the seventh embodiment will be described below. The p-channel transistor M1 is connected, at its source, to a source of a transistor M2 and connected, at its gate and drain, to a drain of the transistor M2. The transistor M1 is diode-connected and is connected in parallel with the transistor M2. The transistors M1 and M2 can implement a primary I-V characteristic, as with the first embodiment. By the primary I-V characteristic, fluctuations in VCDL gain can be cancelled.

The voltage-controlled delay device 121 has load transistors M21 to M24 composing a load. The transistors M1 and M2 have the same channel length and the same channel width as the load transistors M21 to M24 and have a different number of parallel transistors than the load transistors M21 to M24.

As described above, according to the first to fourth embodiments, without adding a special digital control circuit, the cutoff frequency of a PLL circuit can be made constant. As a result, without a voltage-controlled oscillator 104 increasing unnecessary jitter itself, in the PLL circuit the jitter can be maintained constant over a wide range.

Similarly, according to the fifth to eighth embodiments, without adding a special digital control circuit, the cutoff frequency of a DLL circuit can be made constant. As a result, without a voltage-controlled delay device 121 increasing unnecessary jitter itself, in the DLL circuit the jitter can be maintained constant regardless of the amount of delay.

It is to be understood that the above-described embodiments merely describe examples of embodying aspects of the present invention and thus the technical scope of the present invention should not be construed restrictively by the embodiments. Namely, the present invention can be implemented in various forms without departing from the technical concept thereof or the essential characteristics thereof.

What is claimed is:

1. A phase-locked loop circuit comprising:
a phase comparator for comparing phases between a reference signal and a feedback signal and for outputting a phase difference signal indicating a phase difference therebetween;
a charge pump for outputting a charge pump current according to the phase difference signal;
a low-pass filter that includes a resistor and a capacitor, the low-pass filter smoothing the charge pump current and converting the smoothed current into a control voltage;
a voltage-controlled oscillator for generating an oscillation signal with a frequency according to the control voltage;
a frequency divider for generating a frequency-divided signal by frequency-dividing the oscillation signal and for outputting the frequency-divided signal to the phase comparator as the feedback signal; and
a power supply voltage node,
wherein the resistor in the low-pass filter is a variable resistor that is changed according to the control voltage,
wherein the variable resistor has a first field-effect transistor having a drain to which the control voltage is applied,
wherein the low-pass filter has a first capacitor connected between a source of the first field-effect transistor and the power supply voltage node; and
wherein the low-pass filter has a fixed resistor connected between the drain of the first field-effect transistor and the first capacitor.

2. The phase-locked loop circuit according to claim 1, wherein the voltage-controlled oscillator has a load comprising a load field-effect transistor, and
the first field-effect transistor and the load field-effect transistor have a same channel length and a same channel width and have different numbers of parallel transistors.

3. The phase-locked loop circuit according to claim 1, wherein a bias voltage is applied to a gate of the first field-effect transistor.

4. The phase-locked loop circuit according to claim 3, wherein the fixed resistor is connected between the source and the drain of the first field-effect transistor.

5. The phase-locked loop circuit according to claim 4, further comprising a power supply voltage node,
wherein the first field-effect transistor is a p-channel field-effect transistor.

6. The phase-locked loop circuit according to claim 4, further comprising a reference potential node, wherein the first field-effect transistor is an n-channel field-effect transistor, and
the low-pass filter has a first capacitor connected between the source of the first field-effect transistor and the reference potential node.

7. The phase-locked loop circuit according to claim 3, wherein the variable resistor has a second field-effect transistor that is connected in parallel with the first field-effect transistor and is diode-connected.

8. The phase-locked loop circuit according to claim 7, wherein the fixed resistor is connected between the source and the drain of the first field-effect transistor.

9. The phase-locked loop circuit according to claim 8, further comprising a power supply voltage node, wherein the first field-effect transistor and the second field-effect transistor each are a p-channel field-effect transistor.

* * * * *